(12) United States Patent
Shank et al.

(10) Patent No.: US 11,049,932 B2
(45) Date of Patent: Jun. 29, 2021

(54) SEMICONDUCTOR ISOLATION STRUCTURES COMPRISING SHALLOW TRENCH AND DEEP TRENCH ISOLATION

(71) Applicant: GLOBALFOUNDRIES U.S. INC., Santa Clara, CA (US)

(72) Inventors: Steven M. Shank, Jericho, VT (US); Mark David Levy, Williston, VT (US); Bruce W. Porth, Jericho, VT (US)

(73) Assignee: GLOBALFOUNDRIES U.S. Inc., Santa Clara, CA (US)

( * ) Notice: Subject to any disclaimer, the term of this patent is extended or adjusted under 35 U.S.C. 154(b) by 90 days.

(21) Appl. No.: 16/226,640

(22) Filed: Dec. 20, 2018

(65) Prior Publication Data

US 2020/0203478 A1 Jun. 25, 2020

(51) Int. Cl.
| | |
|---|---|
| *H01L 29/06* | (2006.01) |
| *H01L 29/732* | (2006.01) |
| *H01L 21/762* | (2006.01) |
| *H01L 21/763* | (2006.01) |
| *H01L 21/765* | (2006.01) |

(52) U.S. Cl.
CPC ........ *H01L 29/0649* (2013.01); *H01L 21/763* (2013.01); *H01L 21/765* (2013.01); *H01L 21/76229* (2013.01); *H01L 21/76232* (2013.01); *H01L 21/76275* (2013.01); *H01L 21/76286* (2013.01); *H01L 29/732* (2013.01)

(58) Field of Classification Search
CPC ................................................ H01L 29/0649
USPC .......................................................... 257/510
See application file for complete search history.

(56) References Cited

U.S. PATENT DOCUMENTS

| | | | |
|---|---|---|---|
| 5,448,090 A | * | 9/1995 | Geissler .................. C23C 14/48 257/301 |
| 6,121,148 A | | 9/2000 | Bashir et al. |
| 6,566,228 B1 | | 5/2003 | Beintner et al. |
| 6,667,226 B2 | | 12/2003 | Pinto et al. |
| 7,372,102 B2 | | 5/2008 | Chang et al. |
| 7,691,734 B2 | | 4/2010 | Orner et al. |
| 9,577,035 B2 | | 2/2017 | Hurwitz et al. |
| 2007/0122971 A1 | * | 5/2007 | Dobuzinsky ...... H01L 21/26586 438/257 |
| 2007/0205489 A1 | * | 9/2007 | Tilke .................... H01L 29/0649 257/618 |

* cited by examiner

*Primary Examiner* — Ajay Arora
(74) *Attorney, Agent, or Firm* — David Cain

(57) ABSTRACT

The present disclosure relates to isolation structures for semiconductor devices and, more particularly, to dual trench isolation structures having a deep trench and a shallow trench for electrically isolating integrated circuit (IC) components formed on a semiconductor substrate. The semiconductor isolation structure of the present disclosure includes a semiconductor substrate, a shallow trench isolation (STI) disposed over the semiconductor substrate, a deep trench isolation (DTI) with sidewalls extending from a bottom surface of the STI and terminating in the semiconductor substrate, a multilayer dielectric lining disposed on the sidewalls of the DTI, the multilayer dielectric lining including an etch stop layer positioned between inner and outer dielectric liners, and a filler material disposed within the DTI.

18 Claims, 23 Drawing Sheets

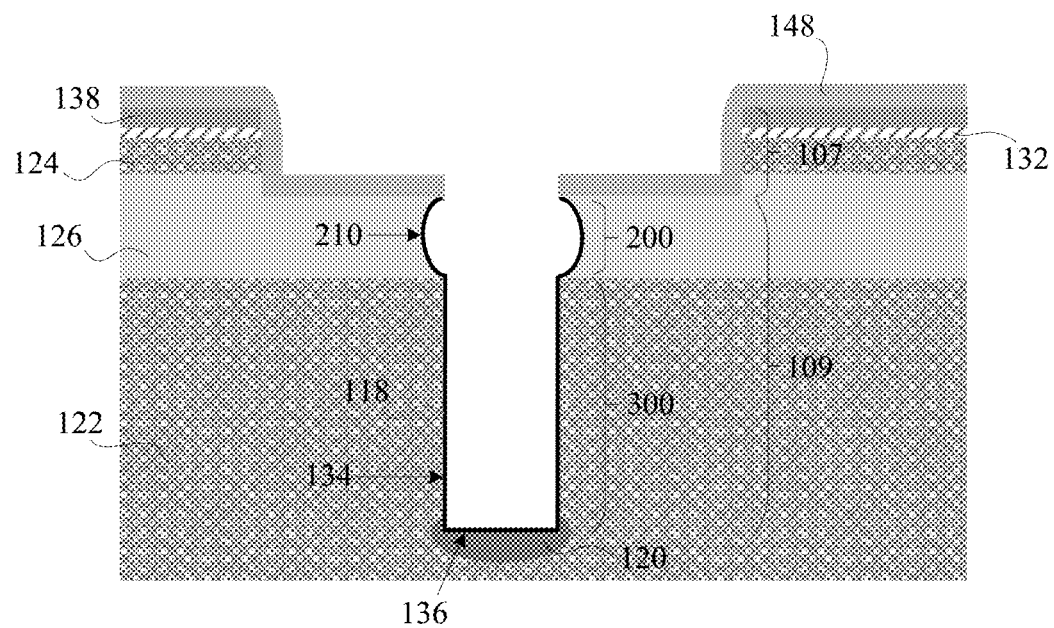
FIG. 3F(i)
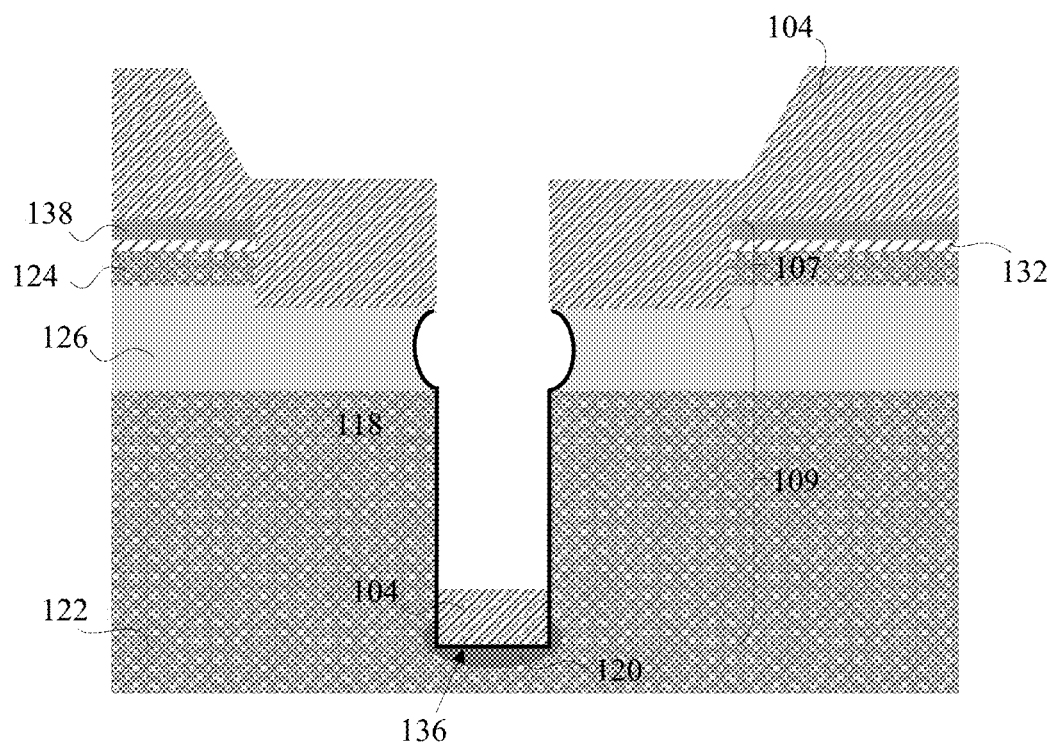
FIG. 3F(ii)

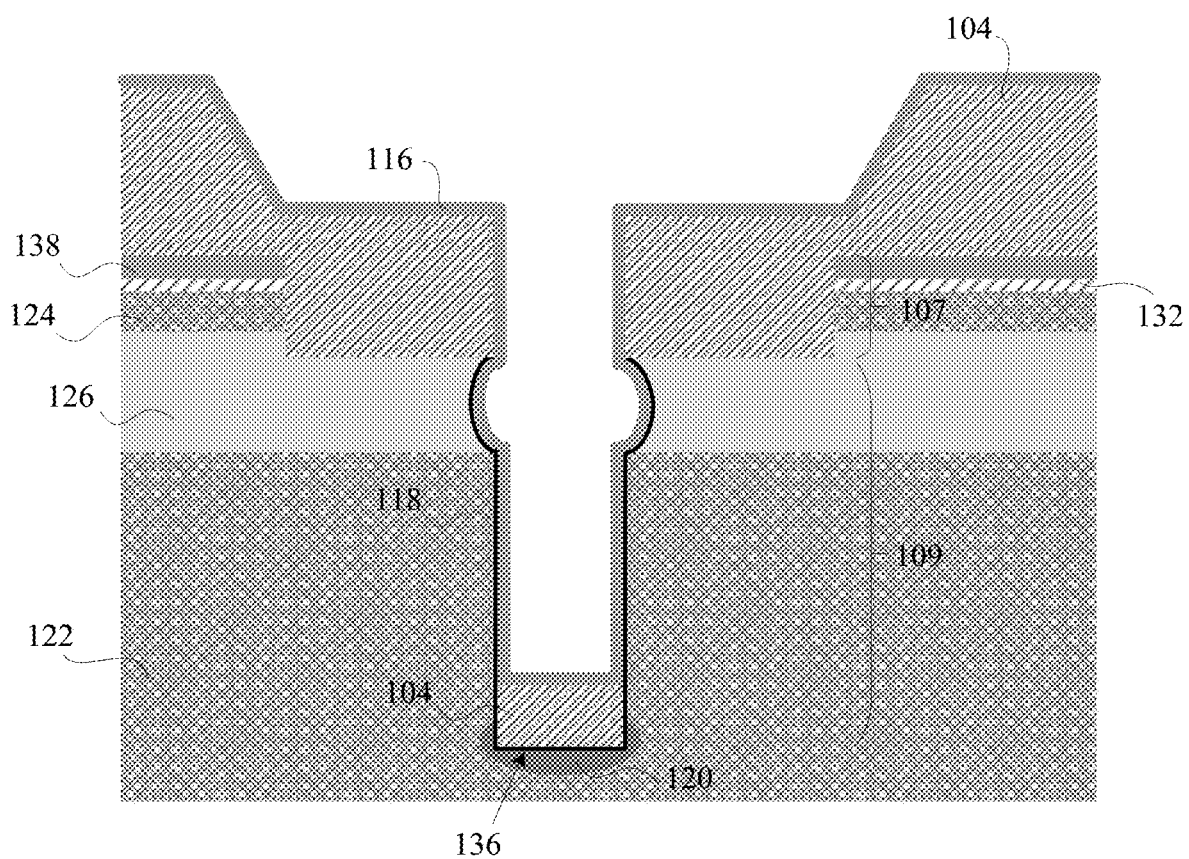
FIG. 3F(iii)

US 11,049,932 B2

SEMICONDUCTOR ISOLATION STRUCTURES COMPRISING SHALLOW TRENCH AND DEEP TRENCH ISOLATION

FIELD OF THE INVENTION

The present disclosure generally relates to isolation structures for semiconductor devices. More particularly, the present disclosure relates to dual trench isolation structures having a deep trench and a shallow trench for electrically isolating integrated circuit (IC) components formed on a semiconductor substrate.

BACKGROUND

Isolation regions are used in semiconductor devices (e.g., complementary metal-oxide semiconductor (CMOS), bipolar, and a combination of bipolar and CMOS (BiCMOS)) to improve operation of transistors and other active components of the semiconductor devices. Conventional techniques enable formation of shallow isolation regions to isolate active semiconductor regions on a surface of a semiconductor substrate. However, with the advancement of IC device technology (e.g., high performance silicon-germanium devices) and an increasing demand for smaller device dimensions, there is an increasingly need for deeper isolation regions to improve overall device performance. Furthermore, with limited availability of areas on a semiconductor substrate for forming isolating regions, it has become increasingly challenging to form both deep and shallow isolation regions.

Conventional techniques to achieve deep and shallow isolation regions may require formation of the deep trenches followed by formation of the shallow trenches. However, the use of such conventional techniques prevents subsequent detection and assessment of defects in the manufactured isolation regions. Additionally, it was found that conventional techniques produces devices containing single crystal spikes that punctured the extrinsic base of transistors, thereby causing current leakage and yield problems. Further, the conventional technique for forming shallow trenches is dependent on the pattern density of the earlier formed deep trenches, which causes process control problems and variability in planarity of the shallow isolation regions.

Therefore, there is a need to provide semiconductor isolation structures and methods of forming the same that can overcome, or at least ameliorate, one or more of the disadvantages as described above.

SUMMARY

In one aspect of the present disclosure, there is provided a semiconductor isolation structure having a semiconductor substrate, a shallow trench isolation (STI) disposed over the semiconductor substrate, a deep trench isolation (DTI) with sidewalls extending from a bottom surface of the STI and terminating in the semiconductor substrate, a multilayer dielectric lining disposed on the sidewalls of the DTI, the multilayer dielectric lining including an etch stop layer positioned between inner and outer dielectric liners, and a filler material disposed within the DTI.

In another aspect of the present disclosure, there is provided a semiconductor isolation structure having a semiconductor substrate, a shallow trench isolation (STI) disposed over the semiconductor substrate, a doped subcollector layer disposed on the semiconductor substrate, a deep trench isolation (DTI) with sidewalls extending from a bottom surface of the STI, through the doped subcollector layer and terminating in the semiconductor substrate, the DTI having a bowed section formed in the doped subcollector layer below the STI, a multilayer dielectric lining disposed on the sidewalls of the DTI, the multilayer dielectric lining including an etch stop layer positioned between inner and outer dielectric liners, and a filler material disposed within the DTI.

In yet another aspect of the present disclosure, there is provided a method of forming a semiconductor isolation structure by providing a semiconductor substrate, forming a first trench having a bottom surface disposed over the semiconductor substrate, forming a second trench by etching an opening in the bottom surface of the first trench that extends into the semiconductor substrate, forming a multilayer dielectric lining on sidewalls of the second trench, the multilayer dielectric lining includes an inner dielectric liner, an etch stop layer and outer dielectric liner, filling the second trench with a filler material, removing portions of the filler material to form a top surface that is substantially level with the bottom surface of the first trench, and removing portions of the etch stop layer and inner dielectric liner to form top edge portions that are recessed below the top surface of the filler material.

Advantageously, etching an opening in the bottom surface of the first trench to form the second trench with the larger depth is found to eliminate problems of shallow trench dependence on deep trench pattern density, thereby improving manufacturing process control and obtaining consistent shallow trench planarity. More advantageously, by etching the opening in the bottom surface of the first trench, it is surprisingly found that the occurrence of single crystal spike defects in the subsequently formed isolation structure is eliminated.

BRIEF DESCRIPTION OF THE DRAWINGS

The present disclosure may be understood by reference to the following description taking in conjunction with the accompanying drawings.

FIGS. 3D-3K are schematic cross section views depicting successive stages of forming a semiconductor isolation structure continuing from FIG. 2C in accordance with another embodiment of the present disclosure.

Figure 1A:
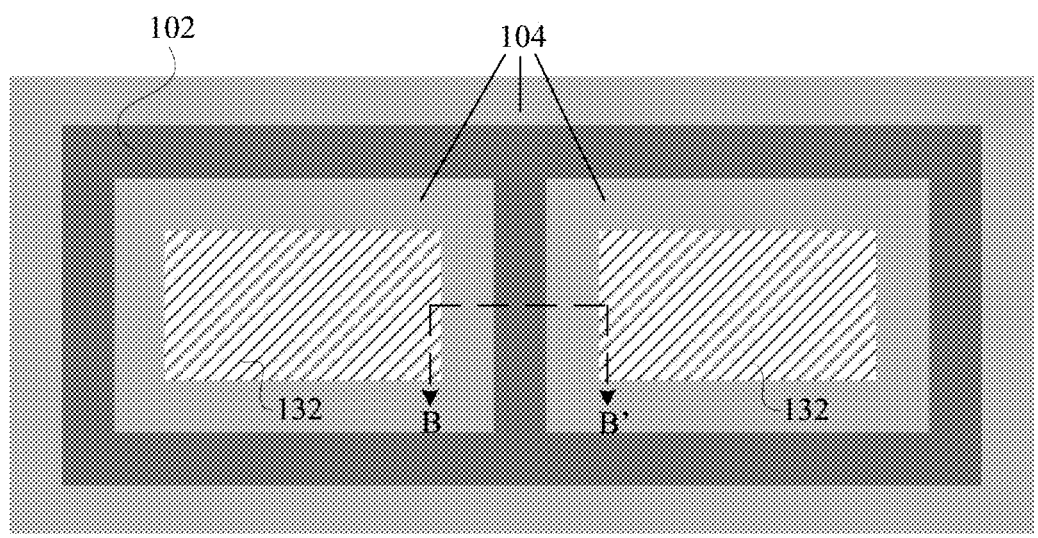
FIG. 1A is a layout depicting a semiconductor isolation structure in accordance with embodiments of the present disclosure.

For simplicity and clarity of illustration, the drawings illustrate the general manner of construction, and certain descriptions and details of well-known features and techniques may be omitted to avoid unnecessarily obscuring the discussion of the described embodiments of the present disclosure. Additionally, elements in the drawings are not necessarily drawn to scale. For example, the dimensions of some of the elements in the drawings may be exaggerated relative to other elements to help improve understanding of embodiments of the present disclosure. The same reference numerals in different drawings denote the same elements, while similar reference numerals may, but do not necessarily, denote similar elements.

DETAILED DESCRIPTION

Figure 1B:
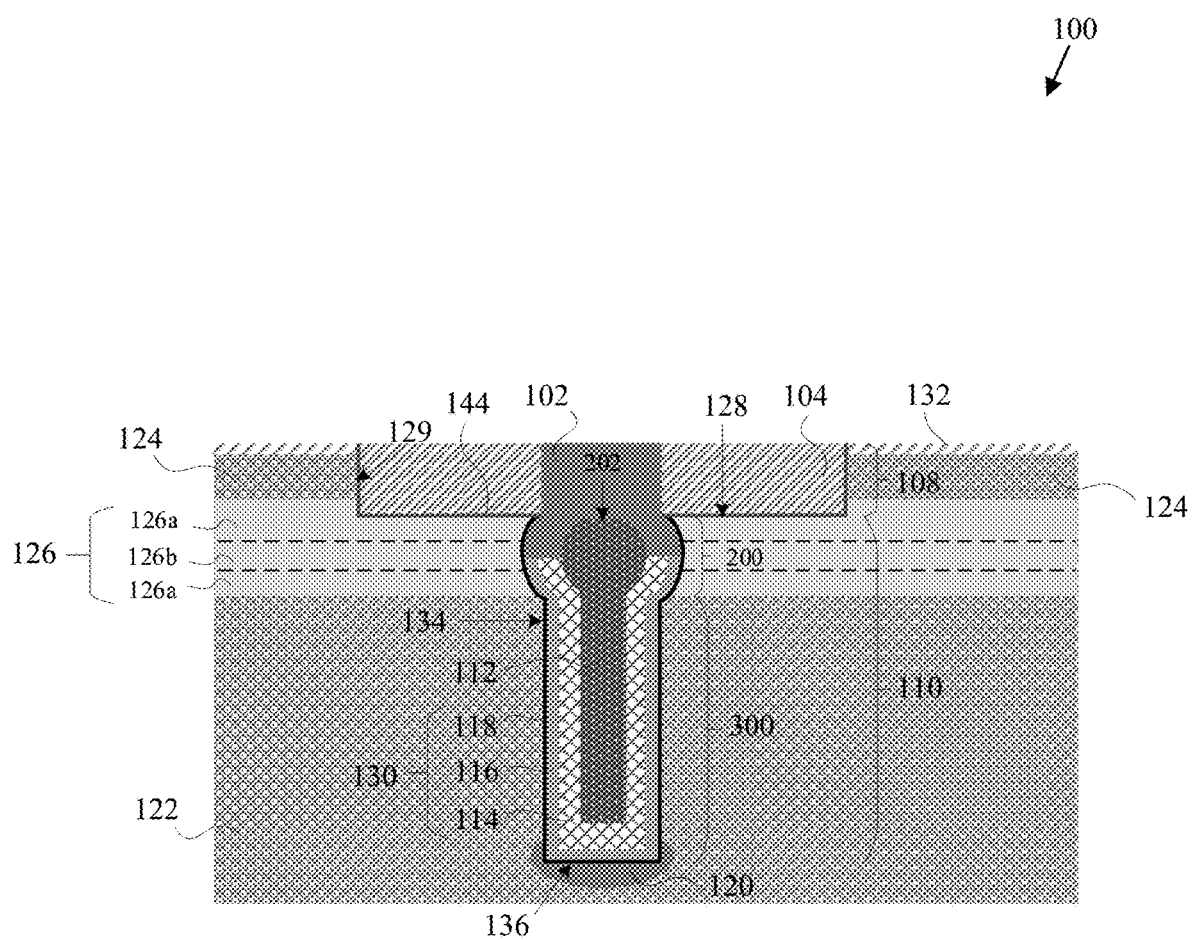
FIGS. 1B and 1B' depict cross section views of embodiments of a semiconductor substrate along the section line B-B' of FIG. 1A in accordance with the present disclosure.
Figure 1B:
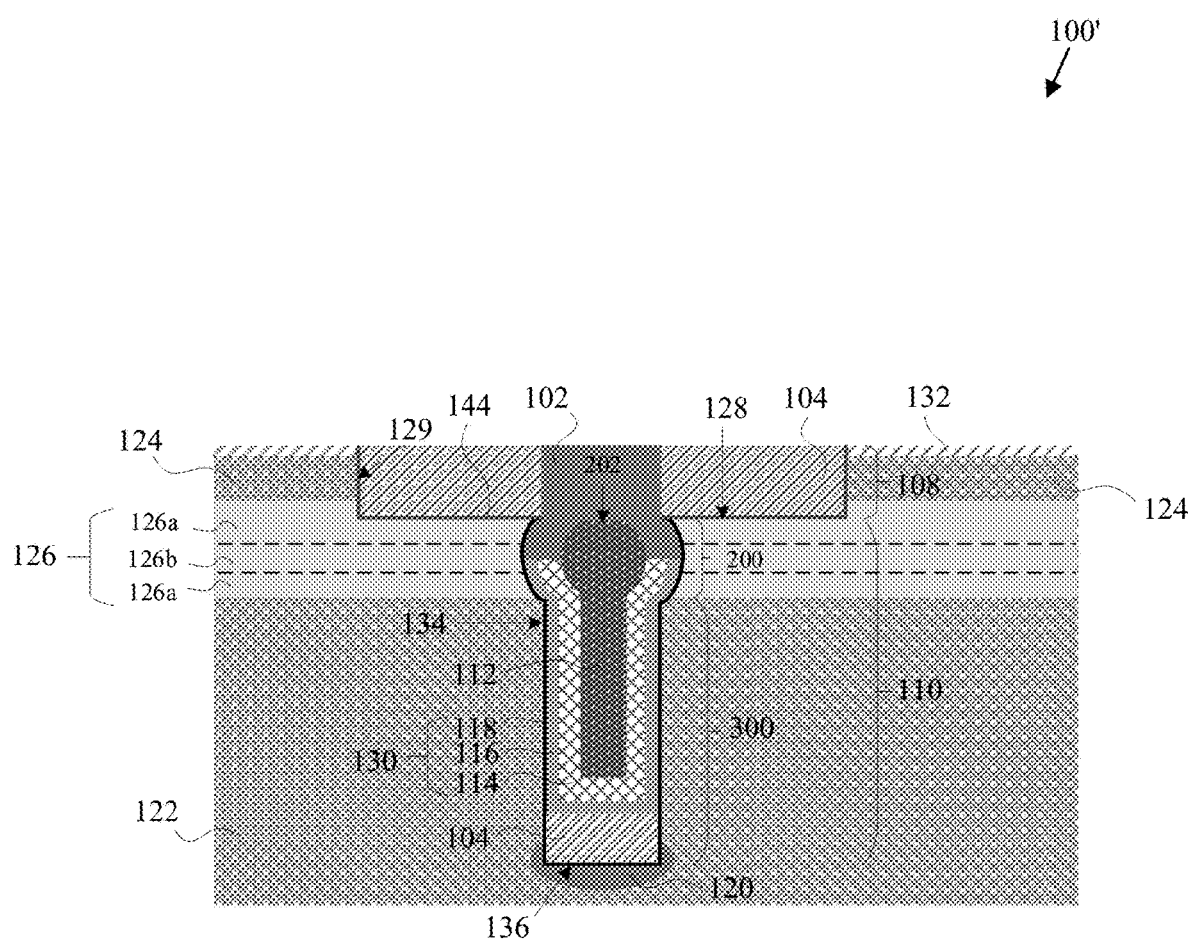

FIGS. 1A-1B' illustrate, in layout and cross section views, respectively, a semiconductor isolation structure in accordance with embodiments of the present disclosure. The semiconductor isolation structure includes a shallow trench isolation formed over a deep trench isolation, where the deep trench isolation has a larger depth than the shallow trench isolation. The semiconductor isolation structure may surround one or more IC components formed on a semiconductor substrate.

Referring to FIG. 1A, the shallow trench isolation includes a capping layer 102 and an oxide layer 104, such as a field oxide layer. In one embodiment, the deep trench isolation is covered by the capping layer 102. The shallow trench isolation surrounds a pad oxide film 132. The IC components (not shown) may be covered by the pad oxide film 132. The IC component may be any circuitry component suitable for integration on a semiconductor substrate, such as a bipolar junction transistor (BJT), a field effect transistor (FET), a capacitor, a semiconductor memory device, a microelectromechanical system (MEMS) sensor, or the like. In another embodiment, the semiconductor isolation structure surrounds a BJT.

Referring to FIG. 1B, the semiconductor isolation structure 100 includes a semiconductor substrate 122, a shallow trench isolation 108 on the semiconductor substrate 122, a deep trench isolation 110 extending from a bottom surface 128 of the shallow trench isolation 108 and terminating in the semiconductor substrate 122. Advantageously, the integration of the deep trench isolation 110 between the shallow trench isolation 108 and the semiconductor substrate 122 enables detection and analysis of any manufacturing defects in the semiconductor isolation structure 100.

In one embodiment, active semiconductor layers 124 are formed in the semiconductor substrate 122. In another embodiment, a doped subcollector layer 126 is disposed between the active semiconductor layers 124 and the semiconductor substrate 122. In some embodiments, the active semiconductor layers 124 are doped with a suitable dopant having one conductivity type (e.g. N type or P type) to function as collector regions of a transistor. In another embodiment, the semiconductor isolation structure includes a channel stop region 120. The channel stop region 120 is located below the deep trench isolation 110, as shown in FIG. 1B.

In one embodiment, the deep trench isolation 110 has a narrower width than the shallow trench isolation 108. In another embodiment, the deep trench isolation 110 has a larger depth than the shallow trench isolation 108. In another embodiment, the deep trench isolation 110 extends through the doped subcollector layer 126 formed on the semiconductor substrate 122. The doped subcollector layer 126 may be doped with dopants of one conductivity type (e.g., N type or P type). In some embodiments, the doped subcollector layer 126 has regions with different dopant concentrations. The doped subcollector layer 126 may have a vertical dopant concentration profile. In the dopant concentration profile, the dopant concentration may vary from a region of lowest dopant concentration to a region of highest dopant concentration, and then back to a region of lowest dopant concentration. In another embodiment, the doped subcollector layer 126 includes a region with a highest dopant concentration 126b buried between two regions with a lowest dopant concentration 126a, as shown in FIG. 1B.

The shallow trench isolation 108 functions as an electrical isolation between adjacent active semiconductor layers 124. The shallow trench isolation 108 includes the capping layer 102 surrounded by the oxide layer 104, as shown in FIG. 1B. In one embodiment, the capping layer 102 is made of a material having a higher molecular packing density than that of the oxide layer 104. In some embodiments, the shallow trench isolation 108 is lined with a thermal oxide film 144. The thermal oxide film 144 lines the sidewalls 129 and bottom surface 128 of the shallow trench isolation 108, as shown in FIG. 1B.

The deep trench isolation 110 includes sidewalls 134 and a bottom surface 136, as shown in FIG. 1B. A multilayer dielectric lining 130 is disposed on the sidewalls 134 of the deep trench isolation 110. The multilayer dielectric lining 130 may include at least three dielectric liners. In one embodiment, the multilayer dielectric lining 130 includes an etch stop layer 116 positioned between an inner dielectric liner 114 and an outer dielectric liner 118. In another embodiment, the multilayer dielectric lining 130 is an oxide/nitride/oxide (ONO) layer. In another embodiment, the outer dielectric liner 118 is disposed on the sidewalls 134 and the bottom surface 136 of the deep trench isolation 110. The etch stop layer 116 is disposed over the outer dielectric liner 118. The inner dielectric liner 114 is disposed over the etch stop layer 116. In some embodiments, the inner and outer dielectric liners have different thicknesses. In another embodiment, the inner dielectric liner 114 is thicker than the outer dielectric liner 118.

In some embodiments, the inner dielectric liner 114 has a thickness of in the range of about 100 nm to about 500 nm. In some embodiments, the outer dielectric liner 118 has a thickness in the range of about 3 nm to about 30 nm. In some embodiments, the etch stop layer 116 has a thickness in the range of about 5 nm to about 50 nm. Advantageously, the inner dielectric liner 114 provides electrical insulation for the deep trench isolation described herein.

A filler material 112 occupies the remainder of the deep trench isolation 110, as shown in FIG. 1B. The filler material 112 may be surrounded by the inner dielectric liner 114 and the capping layer 102. In one embodiment, the filler material contacts the inner dielectric liner 114 and is covered by the capping layer 102.

In some embodiments, the deep trench isolation 110 has a bowed section 200 and a bottom section 300, as shown in FIGS. 1B and 1B'. It should be understood that the sidewalls of the bottom section 300 includes sidewalls that can be parallel to each other, or tapered towards the bottom surface 136 of the deep trench isolation 110. As used herein, the term "tapered" also encompasses "rounded" and "beveled" in which sharp corners or edges are blended to render less distinct the surfaces that form the sharp corners and edges.

FIG. 1B' is a cross section view of an alternative embodiment of a semiconductor isolation structure in accordance with the present disclosure that is similar to that of FIG. 1B, but also includes an oxide layer 104 disposed in the bottom section 300 of the deep trench isolation 110. The oxide layer 104 may be interposed between the etch stop layer 116 and the outer dielectric liner 118. In one embodiment, the oxide layer 104 is disposed on the outer dielectric liner 118 and beneath the filler material 112.

Figure 1C:
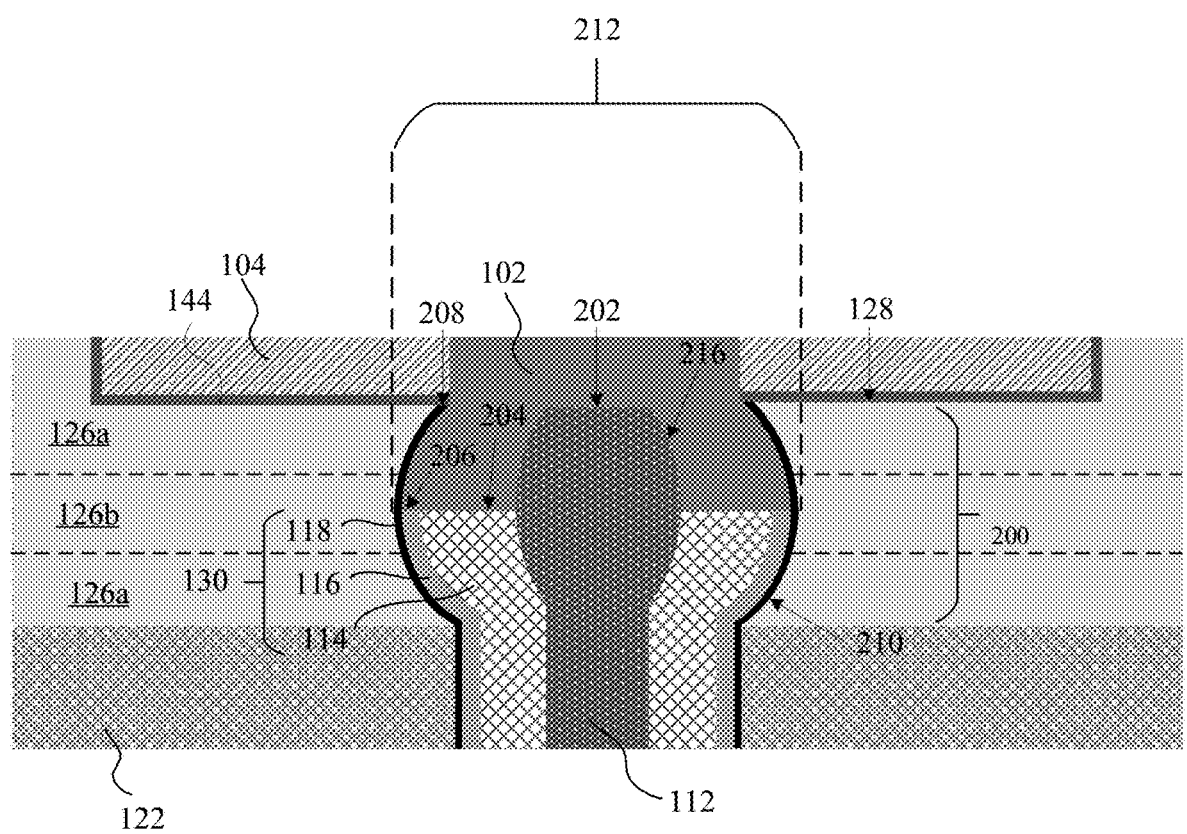
FIG. 1C is an enlarged cross section view depicting a bowed section of a deep trench isolation of the semiconductor isolation structure of FIG. 1B in accordance with embodiments of the present disclosure.

Referring to FIG. 1C, an enlarged cross section view of the bowed section 200 of the deep trench isolation in accordance with embodiments of the present disclosure is shown. The bowed section 200 includes bowed sidewalls 210 of the deep trench isolation. In one embodiment, the bowed section 200 is surrounded by the doped subcollector layer 126. In one embodiment, the bowed section 200 includes a maximum width 212 that is aligned with the highest dopant concentration region 126b of the doped subcollector layer 126, as shown in FIG. 1C.

In the bowed section 200, the filler material 112 has a top surface 202 and bowed sidewalls 216. In one embodiment, the top surface 202 of the filler material 112 is substantially level with the bottom surface 128 of the shallow trench isolation 108. In another embodiment (not shown), the top surface 202 of the filler material 112 is below the bottom surface 128 of the shallow trench isolation 108 and within the bowed section 200. In yet another embodiment (not shown), the top surface 202 of the filler material 112 is below the bottom surface 128 of the shallow trench isolation 108 and above the maximum width 212 of the bowed section 200. Advantageously, by having the top surface 202 of the filler material 112 within the bowed section 200, it is found to prevent occurrence of divots and voids during planarization of the capping layer 202 in subsequent processing steps. Conductive elements (e.g. polysilicon wires) may be formed over the semiconductor isolation structure in subsequent semiconductor fabrication (e.g. front end of line and/or back end of line processes). Advantageously, by having the top surface 202 of the filler material 112 to be substantially level with or below the bottom surface 128 of the shallow trench isolation, it may avoid electrical shorting between the conductive elements and the filler material 112.

The multilayer dielectric lining 130 conforms to the profile of the bowed sidewalls 210, as shown in FIG. 1C. In one embodiment, the etch stop layer 116 and the inner dielectric liner 114 have top edge portions (206 and 204, respectively) that are recessed below the top surface 202 of the filler material 112. In another embodiment, the top edge portions of the etch stop layer 116 and the inner dielectric liner 114 are aligned with the highest dopant concentration region 126b of the doped subcollector layer 126. In alternative embodiments (not shown), the etch stop layer 116 extends above the bowed section and being interposed between the oxide layer 104 and capping layer 102. Advantageously, it is preferable to recess the etch stop layer 116 and the inner dielectric liner 114 to form top edges that are below the top surface 202 to ensure that top surfaces of the shallow trench isolation and the pad oxide film are substantially free of the etch stop layer 116 and the inner dielectric liner 114.

In some embodiments, the outer dielectric liner 118 has a top edge portion 208 that is substantially level with the bottom surface 128 of the shallow trench isolation 108. In one embodiment, it is preferable to have the top edge portion 208 to contact the bottom surface 128 for enhancing electrical isolation. In another embodiment (not shown), the outer dielectric liner 118 has a top edge portion 208 that is recessed below the top surface 202 of the filler material 112. In yet another embodiment (not shown), the outer dielectric liner 118 has a top edge portion 208 that is planar with the top edge portion 206 of the etch stop layer 116 and the top edge portion 204 of the inner dielectric liner 114.

As described herein, the shallow trench isolation includes the capping layer 102. The capping layer 102 covers the deep trench isolation. In one embodiment, the capping layer 102 is disposed on the top surface 202 of the filler material 112 and extends below the top surface 202 to surround a portion of the bowed sidewalls 216 of the filler material 112, as shown in FIG. 1C. The capping layer 102 may contact the multilayer dielectric lining 130. In another embodiment, the capping layer 102 is disposed on the top edge portion 204 of the inner dielectric liner 114 and the top edge portion 206 of the etch stop layer 116.

An embodiment of forming a semiconductor isolation structure in accordance with the present disclosure shall be described below with reference to FIGS. 2A-2K.

Figure 2A:
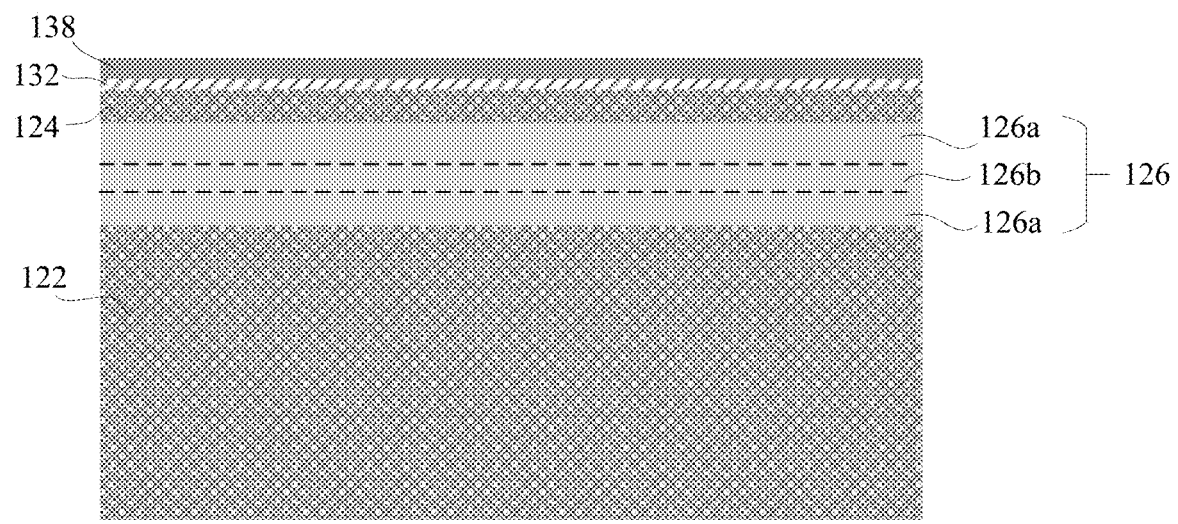
FIGS. 2A-2K are schematic cross section views depicting successive stages of forming a semiconductor isolation structure in accordance with an embodiment of the present disclosure.

FIG. 2A shows a partially processed structure that includes a semiconductor substrate 122, an active semiconductor layer 124, and a doped subcollector layer 126 formed between the active semiconductor layer 124 and the semiconductor substrate 122. The partially processed structure may be formed using suitable semiconductor fabrication processes. For example, the doped subcollector layer 126 may be formed by performing an implantation process (e.g., ion implantation) on a semiconductor substrate 122. During implantation, the subcollector layer 126 may be doped with a suitable dopant of one conductivity type, such as an N-type dopant (e.g. arsenic, phosphorus, or antimony) or a P-type dopant (e.g. boron, aluminium, or gallium).

The subcollector layer 126 may be doped such that it contains a vertical doped concentration profile having a highest dopant concentration region 126b in between two lowest dopant concentration regions 126a. For example, the doped subcollector layer 126 includes an N+ doped region 126b buried between two N-type doped regions 126a. The highest dopant concentration region 126b may have a higher dopant concentration than the lowest dopant concentration regions 126a by at least one factor of 10. In one embodiment, the highest dopant concentration region 126b has a dopant concentration of about $10^{15}$ atom/cm$^3$. In another embodiment, the lowest dopant concentration regions 126a have a dopant concentration of about $10^{14}$ atom/cm$^3$.

An epitaxial growth of a semiconductor material (e.g. silicon, germanium, SiGe) is performed on the formed doped subcollector layer 126. The grown semiconductor material may be subsequently doped by any suitable implantation processes with a suitable dopant to form an active semiconductor layer 124. The active semiconductor layer 124 may be P-type doped or N-type doped depending on the conductivity type of the doped subcollector layer 126.

As also shown in FIG. 2A, a pad oxide film 132 formed on the active semiconductor layer 124 and a pad nitride film 138 formed on the pad oxide film 132. The pad oxide film 132 and the pad nitride film 138 may be formed by any suitable deposition processes. The pad nitride film 138 may include a nitride such as silicon nitride. The thickness of the pad nitride film 138 is in the range of about 50 nm to about 200 nm. The pad oxide film 132 may include an oxide such as silicon dioxide. The thickness of the pad oxide film 132 is in the range of about 2 nm to about 20 nm.

The semiconductor substrate 122 and the active semiconductor layer 124 may be made of any suitable semiconductor material, such as silicon, germanium, or silicon germanium. The semiconductor substrate 122 may also include an organic semiconductor or a layered semiconductor, such as Si/SiGe, a silicon-on-insulator or a SiGe-on-insulator. In one embodiment, the semiconductor substrate 122 is preferably a silicon substrate. The semiconductor substrate 122 may be a P-type or an N-type substrate depending on the type of junction desired (e.g., NPN or PNP-type junction transistor).

Figure 2B:
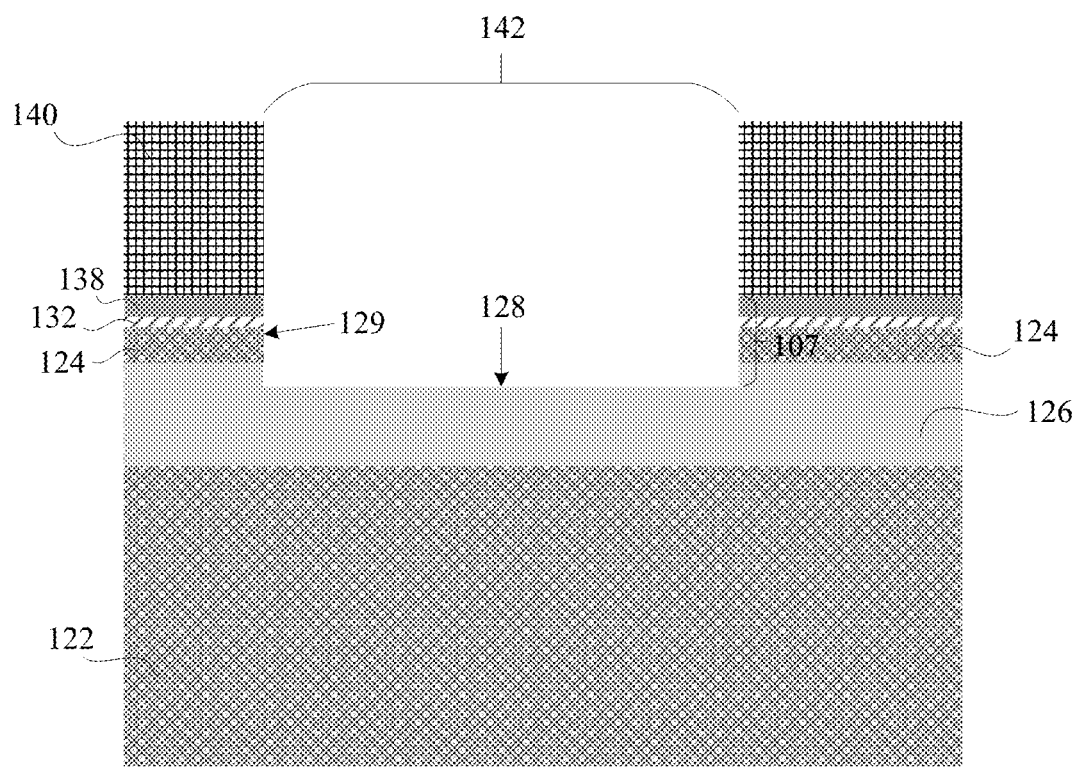

FIG. 2B shows a partially processed structure after performing a patterning step to form a first trench 107. In one embodiment, a photoresist layer 140 is deposited on the pad nitride film 138 and patterned using suitable patterning techniques to form a first trench opening 142. The photoresist layer 140 may include any suitable photo-sensitive organic material. Next, etching processes are performed to vertically etch through the pad nitride film 138, the pad oxide film 132, and the active semiconductor layer 124 to form the first trench 107. The etching may recess a top surface of the doped subcollector layer 126, as shown in FIG. 2B. The first trench 107 has sidewalls 129 and a bottom surface 128. In one embodiment, the first trench 107 has a depth in the range of about 0.2 μm to about 0.6 μm.

Figure 2C:
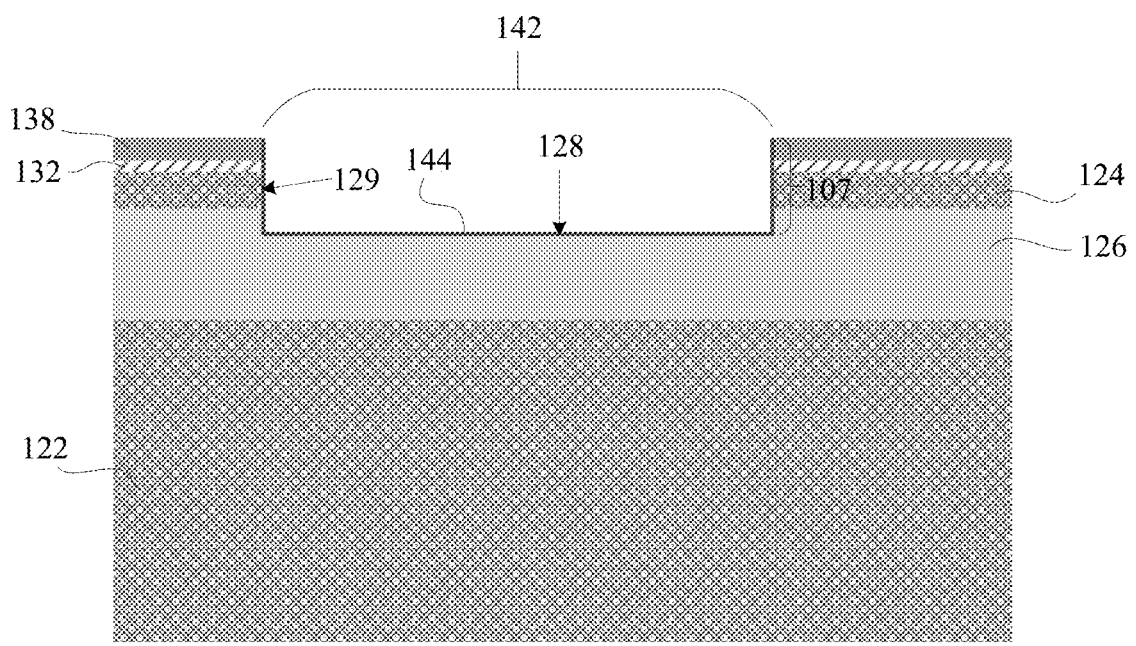

As shown in FIG. 2C, the photoresist layer 140 is removed, and a thermal oxide film 144 is formed in the first trench 107 that lines the sidewalls 129 and the bottom surface 128 of the first trench. The thermal oxide film 144 may include an oxide such as silicon dioxide. In one embodiment, the thermal oxide film 144 may be formed by using a thermal oxidation process. The thermal oxidation process may include an operating temperature range of about 800° C. to about 1100° C. The thermal oxidation process may additionally drive the diffusion of the dopant atoms from the highest dopant concentration region 126*b* into the lowest dopant concentration regions 126*a*. The diffusion of the dopant atoms may reduce the gradient of the dopant concentration profile in the doped subcollector layer 126.

Figure 2D:
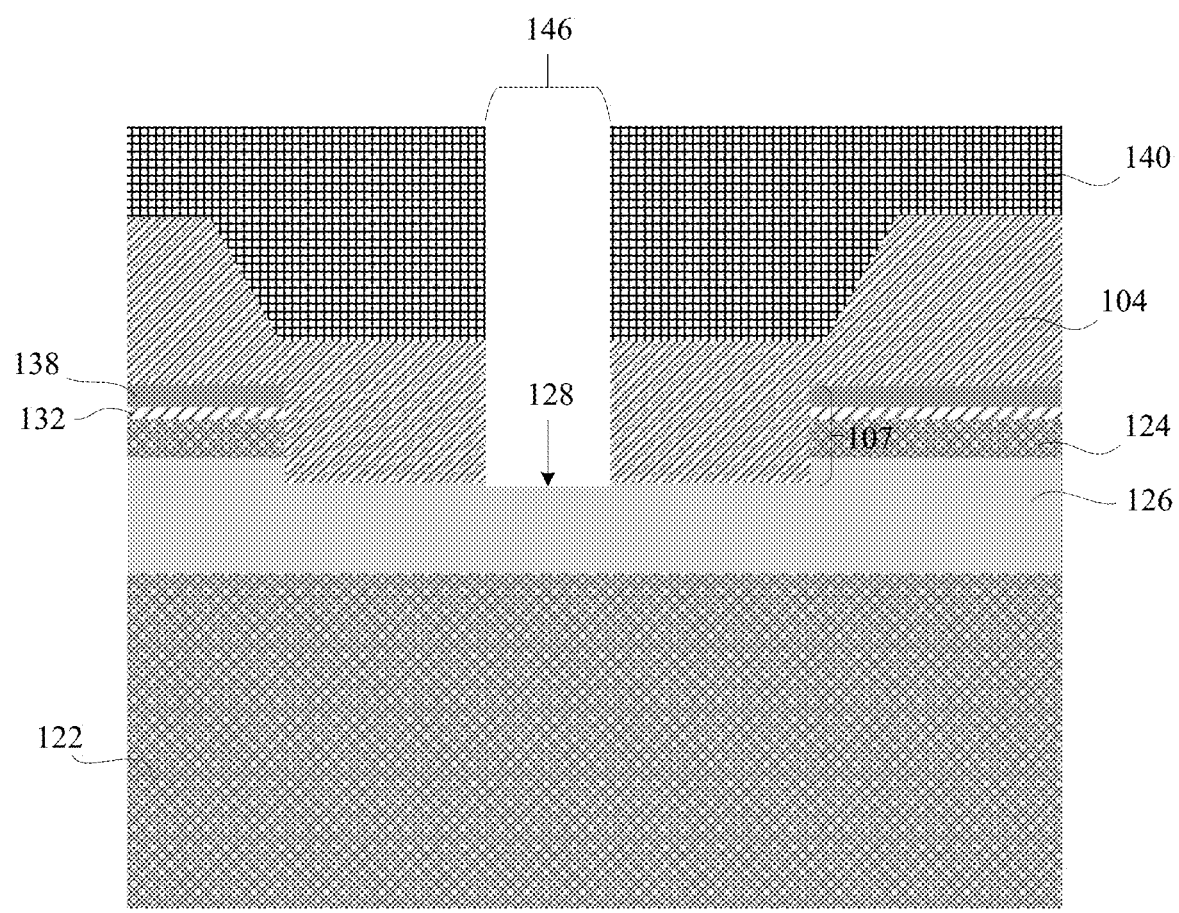
Figure 2E:
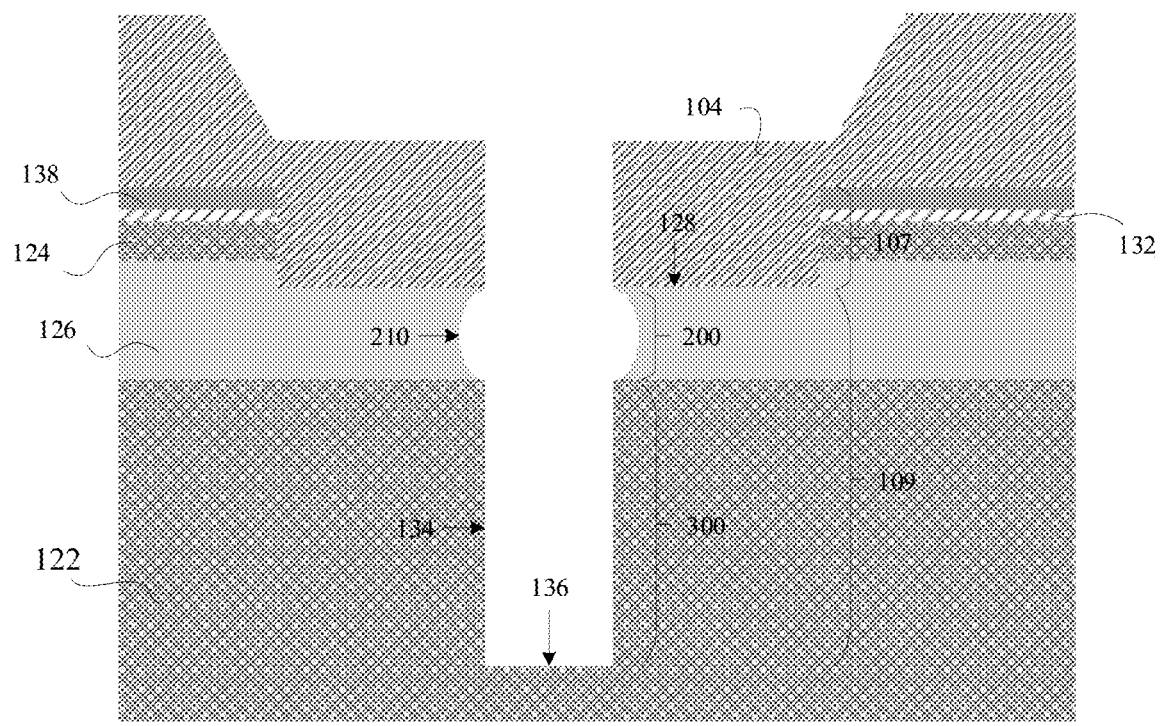

FIGS. 2D-2E illustrates an example of forming a second trench in the partially processed structure shown in FIG. 2C in accordance with the present disclosure. As described herein, the second trench has a larger depth than the first trench and is formed after formation of the first trench.

Referring to FIG. 2D, an oxide layer 104 is formed by suitable deposition processes over the pad nitride film 138 and fills the first trench 107. In one embodiment, the oxide layer 104 is deposited on the thermal oxide film 144 in the first trench (not shown). The oxide layer 104 is preferably formed by a high density plasma deposition technique. The oxide layer 104 may include an oxide material such as silicon dioxide, silicon oxynitride, tetraethyl orthosilicate (TEOS), or silicon-rich silicon oxide. Another photoresist layer 140 is formed on the oxide layer 104 and then patterned using suitable patterning techniques. Using the patterned photoresist layer 140 as an etch mask, the oxide layer 104 is then etched to expose the bottom surface 128 of the first trench 107, thereby forming a second trench opening 146. The etching may be performed using suitable etching techniques such as reactive ion etching (RIE). Next, the photoresist layer is stripped by suitable techniques such as plasma ashing, oxygen plasma, oxygen-containing plasma, or sulfur peroxide wet acid stripping. The exposed bottom surface of the first trench 107 may be cleaned with a suitable cleaning agent such as sulfuric acid or hydrogen peroxide.

Referring to FIG. 2E, the bottom surface 128 of the first trench 107 is etched to form an opening that extends into the semiconductor substrate 122, thereby forming a second trench 109. In one embodiment, the etching process for the second trench 109 terminates in the semiconductor substrate 122. In another embodiment, etching the opening for the second trench 109 includes etching through the doped subcollector layer 126 before terminating the etching process in the semiconductor substrate 122. Here, the etching may be performed using anisotropic etching techniques, such as ME.

The etching process to form the second trench 109 may include a vertical etch and a lateral etch. In particular, the etching of the doped subcollector layer 126 may include both vertical and lateral etching, and the etching of the semiconductor substrate 122 may include only a vertical etch. In one embodiment, during etching of the doped subcollector layer 126, the lateral etch removes a portion of the doped subcollector layer 126 to form a bowed section 200 of the second trench 109, as shown in FIG. 2E. The bowed section 200 has bowed sidewalls 210 and a maximum width 212. The extent of lateral etching may be a function of the dopant concentration profile in the doped subcollector layer 126. For example, a larger extent of lateral etch occurs at a higher dopant concentration region in the doped subcollector layer 126. If the doped subcollector layer 126 contains a highest dopant concentration region 126*b* in between two lowest dopant concentration regions, then the resulting etched portion of the doped subcollector layer 126 has a concave profile, with the highest dopant concentration region 126*b* having the largest concavity. The width of the bowed section 200 can indicate the concavity of the bowed sidewalls 210.

In another embodiment, during etching of the semiconductor substrate 122, the vertical etch forms a bottom section 300 of the second trench 109. The bottom section 300 includes sidewalls 134 and a bottom surface 136, as shown in FIG. 2E. It should be understood that the vertical etch may also form sidewalls 134 that are tapered towards the bottom surface 136.

In one embodiment, the formed second trench 109 has a narrower width than the first trench 107. In particular, the second trench 109 has a preferred width in the range of about 0.5 μm to about 3 μm. In another embodiment, the second trench 109 has a depth in the range of about 1 μm to about 10 μm. In particular, the second trench 109 has a preferable depth in the range of about 4 μm to about 6 μm.

Figure 2F:
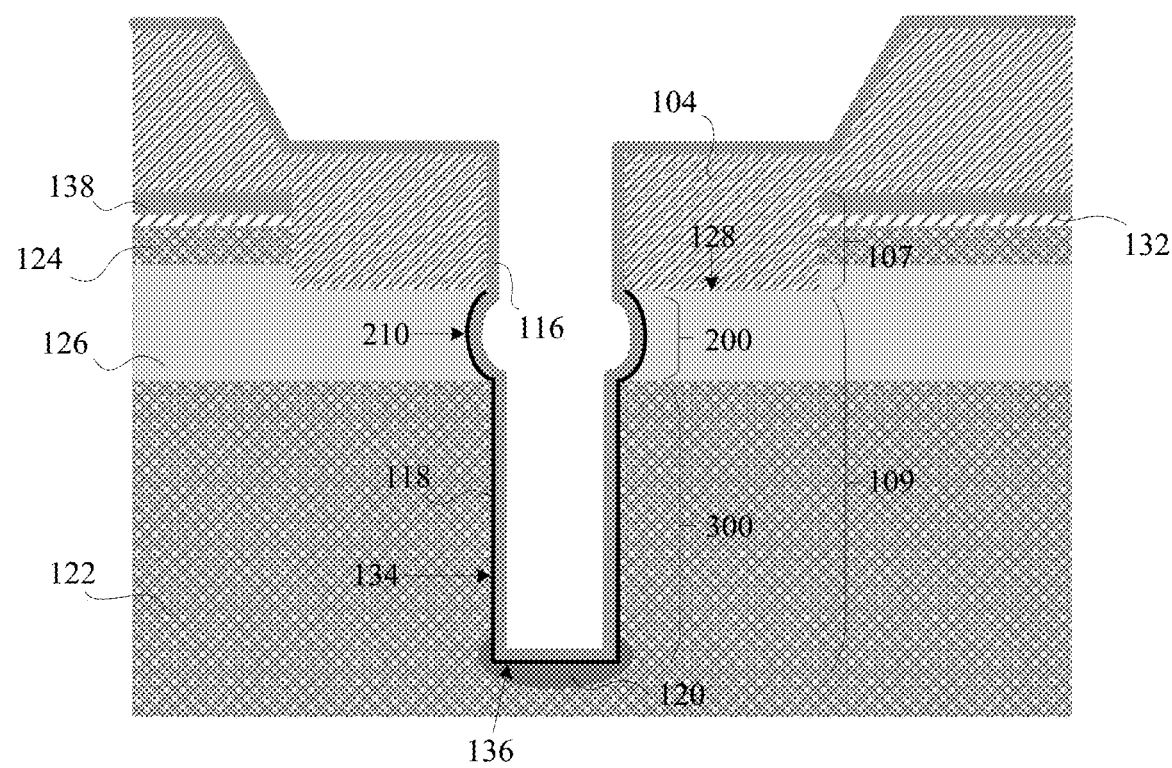

FIG. 2F illustrates an example of forming an outer dielectric liner 118 and an etch stop layer 116 in the partially processed structure shown in FIG. 2E in accordance with the present disclosure. The sidewalls 210 and 134 and bottom surface 136 of the second trench 109 may be coated, covered or lined with the outer dielectric liner 118. In one embodiment, the outer dielectric liner 118 is formed on the exposed sidewalls 134 and the bottom surface 136 of the second trench 109 by using a thermal oxidation process. The thermal oxidation process may include heating at an operating temperature range of about 800° C. to about 1100° C.

In another embodiment, the outer dielectric liner 118 conforms to the bowed sidewalls 210 of the bowed section 200. In some embodiments, the outer dielectric liner 118 includes an oxide material, such as silicon dioxide. The thickness of the outer dielectric liner 118 is preferably in the range of about 20 Å to about 200 Å. Etch defects may be found on the sidewalls of the formed second trench after etching the bottom surface of the first trench. Advantageously, the formation of the outer dielectric liner 118 is found to passivate etch defects on the sidewalls 210 and 134 of the second trench 109 after etching the bottom surface of the first trench 107. More advantageously, the outer dielectric liner 118 may function as a diffusion barrier to prevent diffusion of atoms between the isolation structure and the IC components.

A channel stop region 120 is subsequently formed below the bottom surface 136 of the second trench 109 and within the semiconductor substrate 122. The channel stop region 120 may be formed by implanting a suitable dopant through the outer dielectric liner 118 formed on the bottom surface 136 of the second trench 109 and into the semiconductor substrate 122. The dopant may be implanted in a direction substantially perpendicular to the bottom surface 136. The dopant implantation of the channel stop region 120 may form a semiconductor junction with the opposite polarity dopant in the surrounding semiconductor material. The surrounding semiconductor material may have regions of either N-type or P-type polarity. These regions may be formed by the tails of the subcollector layer 126. In some embodiments, the dopant for implantation of the channel stop region 120 may be boron (to form a junction with surrounding N-type regions) or either arsenic or phosphorous (to form a junction with surrounding P-type regions).

Next, an etch stop layer 116 is formed to cover the outer dielectric liner 118 and the oxide layer 104, as shown in FIG. 2F. The etch stop layer 116 may be formed by conventional deposition processes. In one embodiment, the etch stop layer 116 is deposited using chemical vapor deposition (CVD). In another embodiment, the formed etch stop layer 116 conforms to the contours of the outer dielectric liner 118 within the second trench 109 and the oxide layer 104. In some embodiments, the etch stop layer 116 includes a nitride material, such as silicon nitride.

Figure 2G:
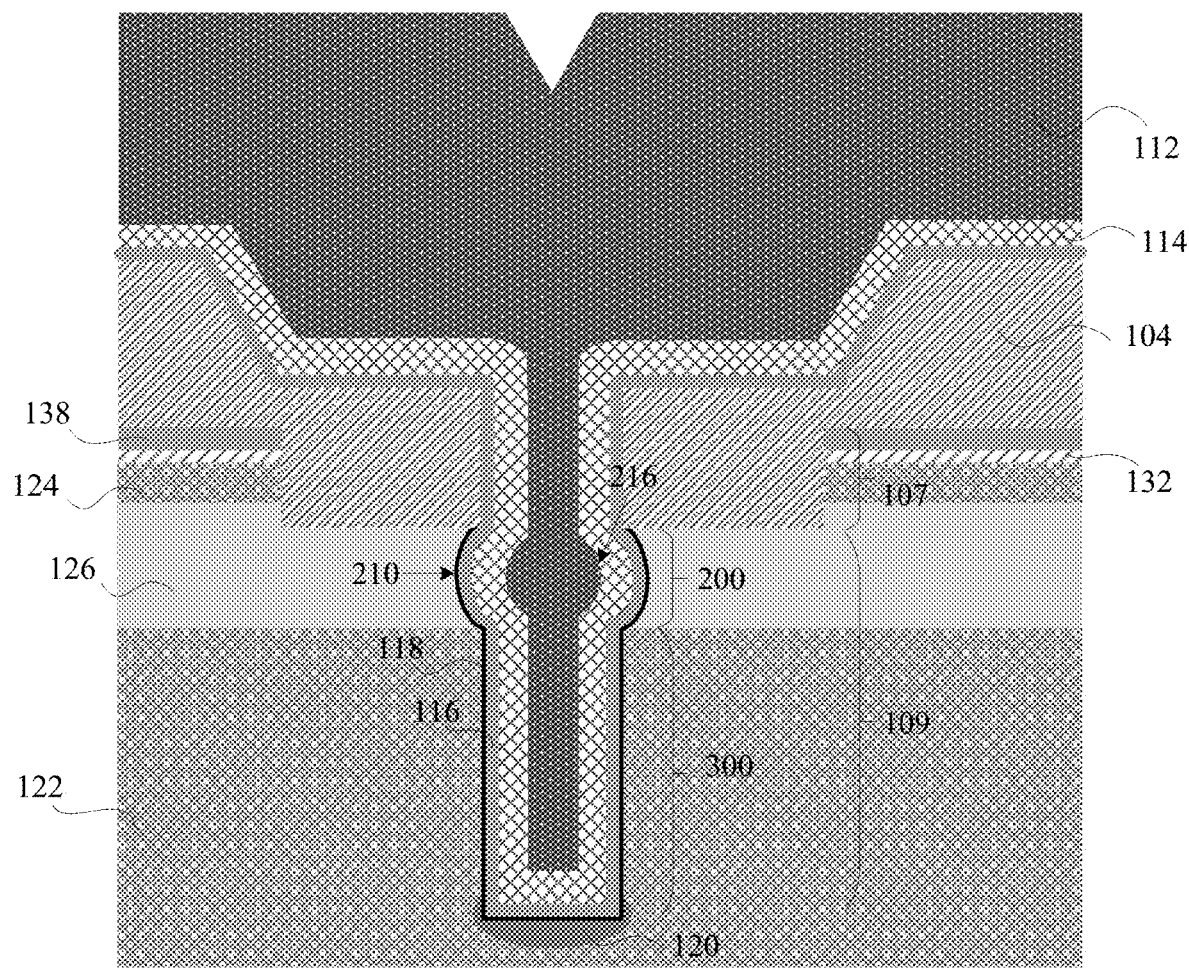

FIGS. 2G-2L illustrate successive stages of processing the partially processed structure described in FIG. 2F. Referring to FIG. 2G, an inner dielectric liner 114 is formed over the previously formed etch stop layer 116. In one embodiment, the multilayer dielectric lining includes the outer dielectric liner 118, the etch stop layer 116 and the inner dielectric liner 114. The formation of the inner dielectric liner 114 may be performed using any suitable deposition processes. In another embodiment, the inner dielectric liner 114 is deposited using CVD. The inner dielectric liner 114 is deposited on the etch stop layer 116. In yet another embodiment, the formed inner dielectric liner 114 conforms to the bowed sidewalls 210 of the second trench 109, as shown in FIG. 2G. The inner dielectric liner 114 may differ from the oxide layer 104 in terms of molecular packing density. The difference in molecular packing density is determined by chemical analysis methods such as secondary ion mass spectrometry (SIMS), X-ray photoelectron spectroscopy (XPS), Energy-dispersive X-ray spectroscopy (EDX), and Raman spectroscopy. In some embodiments, the oxide layer 104 has a higher molecular packing density than the inner dielectric liner 114.

Next, a filler material 112 is deposited over the formed inner dielectric liner 114 and also fills the remainder of the second trench 109. The filling of the filler material 112 may overfill the second trench 109 followed by the first trench 107, and overlie the surface of the inner dielectric liner 114, as shown in FIG. 2G. The deposition of the filler material 112 may be performed using conventional deposition processes. In another embodiment, the filler material 112 in the second trench 109 has bowed sidewalls 216 corresponding to the concavity of the bowed sidewalls 210 of the second trench 109. In some embodiments (not shown), the deposition of filler material 112 into the bowed section may result in formation of a void within the deposited filler material 112 due to material pinch-off at the interface between the first and second trenches. The void may be buried within the bowed section 200 of the second trench 109. The buried void may have a maximum width aligning with the maximum width of the bowed section 200.

In some embodiments, the inner dielectric liner 114 includes an oxide material such as silicon dioxide, silicon oxynitride, tetraethyl orthosilicate (TEOS). The filler material 112 may be a conductor, an insulator or a high resistivity conductor. In some embodiments, the filler material 112 includes a silicon containing material, such as polysilicon, amorphous silicon, polycrystalline silicon containing alloy, or an amorphous silicon containing alloy. In one embodiment, the filler material 112 is preferably un-doped polysilicon.

Figure 2H:
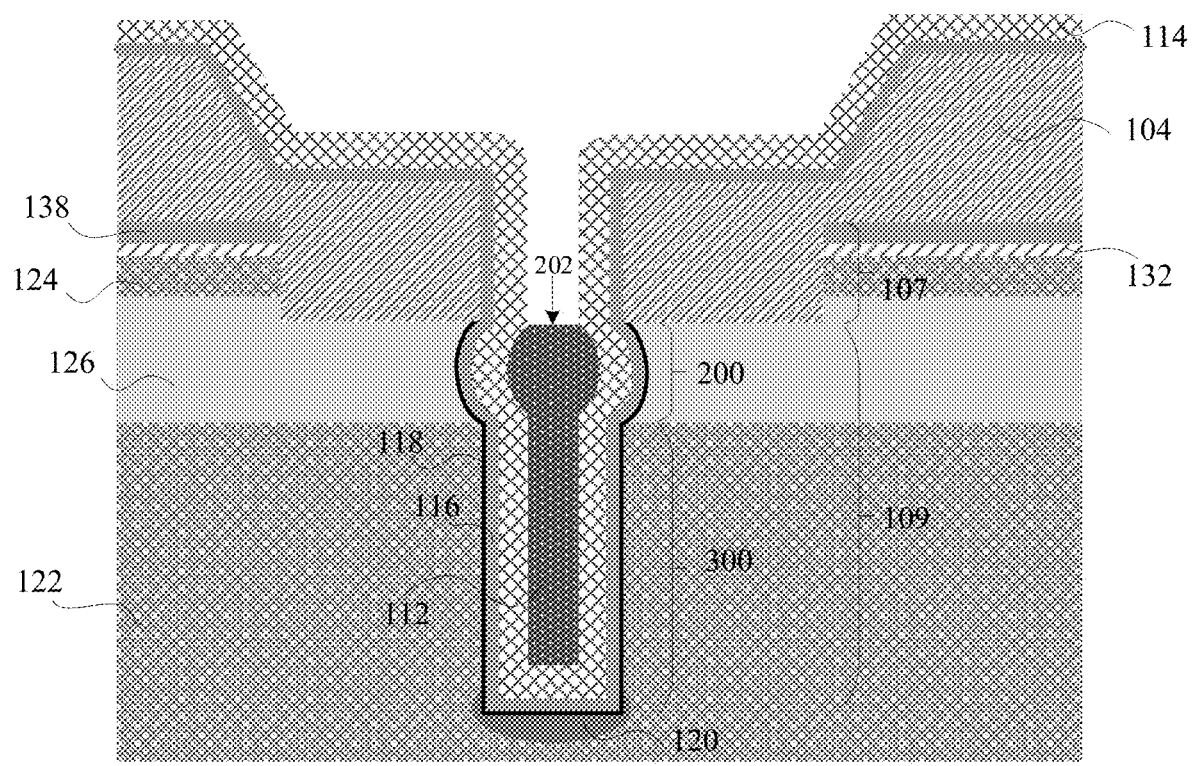

Referring to FIG. 2H, portions of the filler material 112 are removed to obtain a top surface 202 of the filler material 212 that is substantially level with the bottom surface of the first trench 107. In some embodiments (not shown), the top surface 202 is below the bottom surface 128 of the first trench 107. In other embodiments (not shown), recessing of the top surface 202 below the bottom surface 128 may expose the buried void within the bowed section of the second trench. Portions of the filler material 112 may be removed by any suitable etching processes. The removal of the filler material 112 exposes the inner dielectric material 114, as shown in FIG. 2H.

Figure 2I:
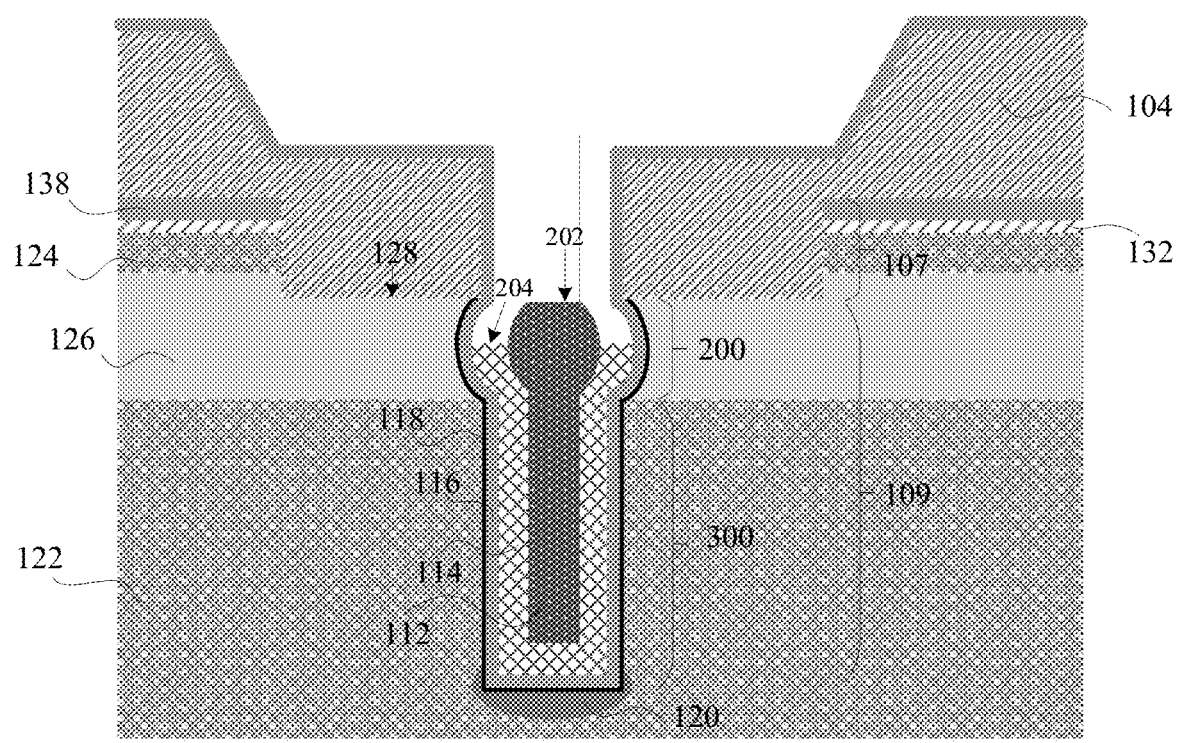

Referring to FIG. 2I, portions of the inner dielectric material 114 are removed to form a top edge portion 204 that is recessed below the top surface 202 of the filler material 112. In one embodiment, the removal of the inner dielectric material 114 is performed using a wet etch process. The etchant used to remove the inner dielectric material 114 may be hydrofluoric acid. The removal of the inner dielectric material 114 exposes the etch stop layer 116, as shown in FIG. 2I. Advantageously, the etch stop layer 116 functions as an additional electrical insulator to isolate adjacent IC components formed on the semiconductor substrate. More advantageously, the etch stop layer 116 serves as a protective barrier for the underlying oxide layer 104 and the outer dielectric liner 118 during etching of the inner dielectric liner 114.

Figure 2J:
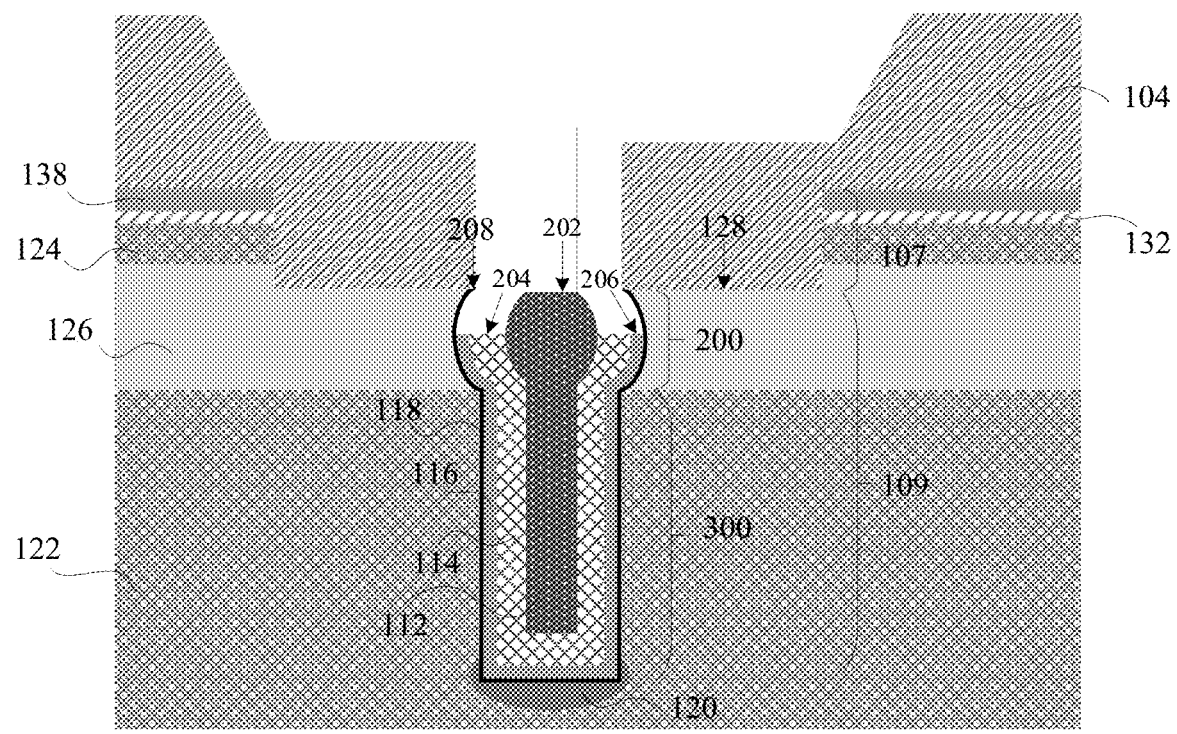

Referring to FIG. 2J, portions of the etch stop layer 116 are removed to form a top edge portion 206 that is recessed below the top surface 202 of the filler material 112. In one embodiment, the removal of the etch stop layer 116 is performed using a wet etch process. The etchant used to remove the etch stop layer 116 may be hot phosphoric acid. The removal of the etch stop layer 116 exposes the oxide layer 104 covering the pad nitride film 138 and the first trench 107. The removal of the etch stop layer 116 also exposes the outer dielectric liner 118 that lined the bowed sidewalls 210 of the second trench 109. As described herein, the outer dielectric liner 118 has a top edge portion 208 that is substantially level with the bottom surface 128 of the first trench 107. In some embodiments (not shown), the outer dielectric liner 118 is etched back to form a top edge portion 208 that is recessed below the top surface 202 of the filler material 112.

Figure 2K:
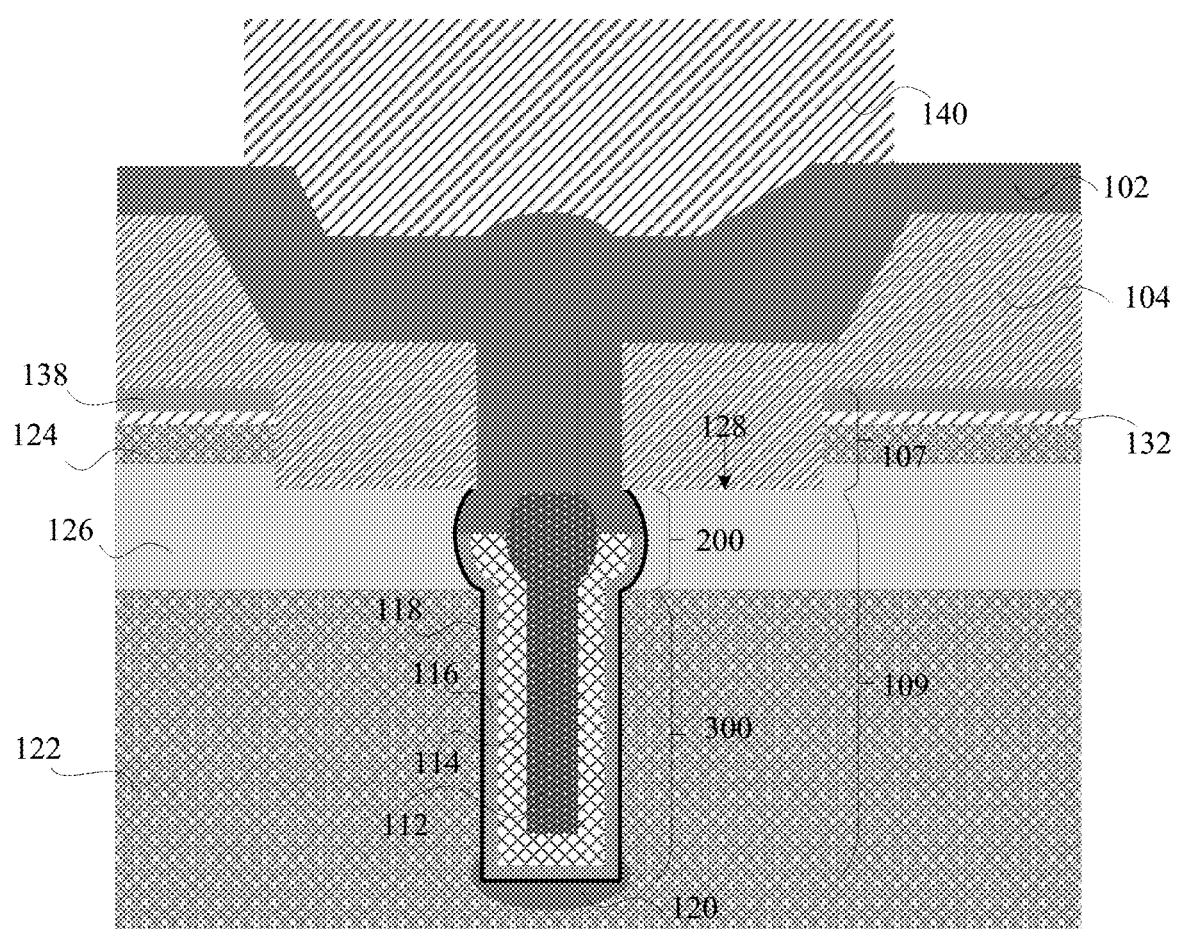

Referring to FIG. 2K, a capping layer 102 is formed over the oxide layer 104 and covers the first and second trenches (107 and 109, respectively). In one embodiment, the capping layer 102 is formed by performing a high density plasma deposition process. The capping layer 102 may be made of an oxide material, such as silicon dioxide, silicon oxynitride, TEOS. Advantageously, the deposition of the capping layer 102 may seal any exposed voids within the recessed filler material 112 in the bowed section 200. More advantageously, having the top surface 202 of the filler material 112 to be substantially level with or below the bottom surface 128 of the first trench 107 together with the capping layer 102 covering the top surface 202 is found to reduce the difference in mechanical stress (e.g. due to thermal expansion) between the shallow and deep trench isolations described herein.

A photoresist layer 140 is then deposited over the capping layer 102 and then patterned to cover only the first and second trenches (107 and 109, respectively). The patterned photoresist layer 140 acts as a mask for subsequent etching of the capping layer 102 to remove portions of the capping layer 102 that do not overlie the first and second trenches (107 and 109, respectively). Next, the photoresist layer 140 is removed, followed by polishing (e.g. chemical mechanical planarization (CMP)) to planarize the oxide layer 104 and the capping layer 102 with the pad oxide film 132. Following the polish step, the pad nitride layer 138 is removed with hot phosphoric acid and the semiconductor isolation structure described in FIG. 1B is formed.

Another embodiment of forming a semiconductor isolation structure in accordance with the present disclosure shall be described below with reference to FIGS. 3D-3K that illustrates alternative processing steps to those described in FIGS. 2A-2C.

Figure 3D:
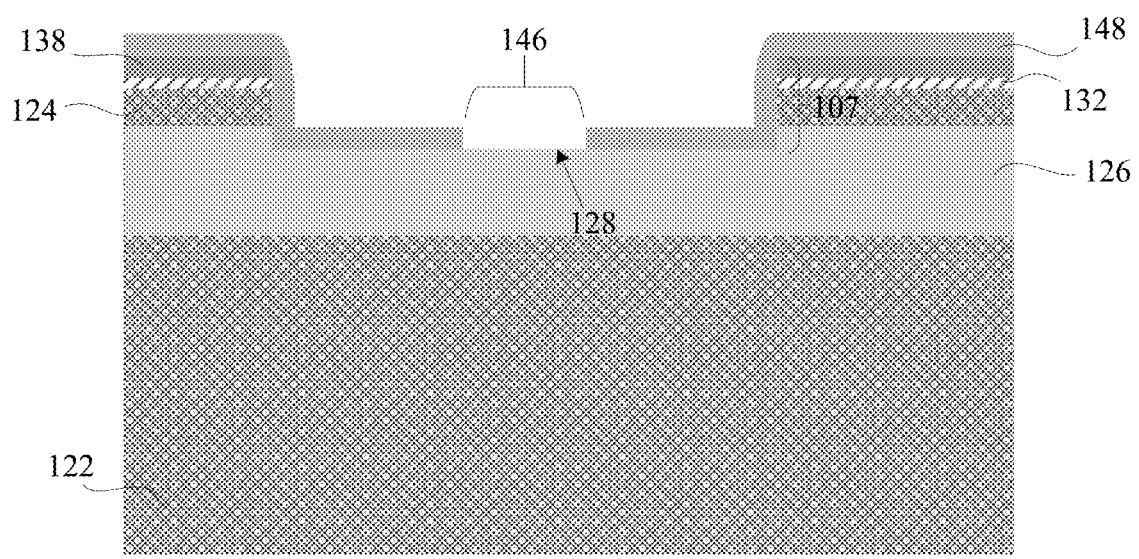
Figure 3E:
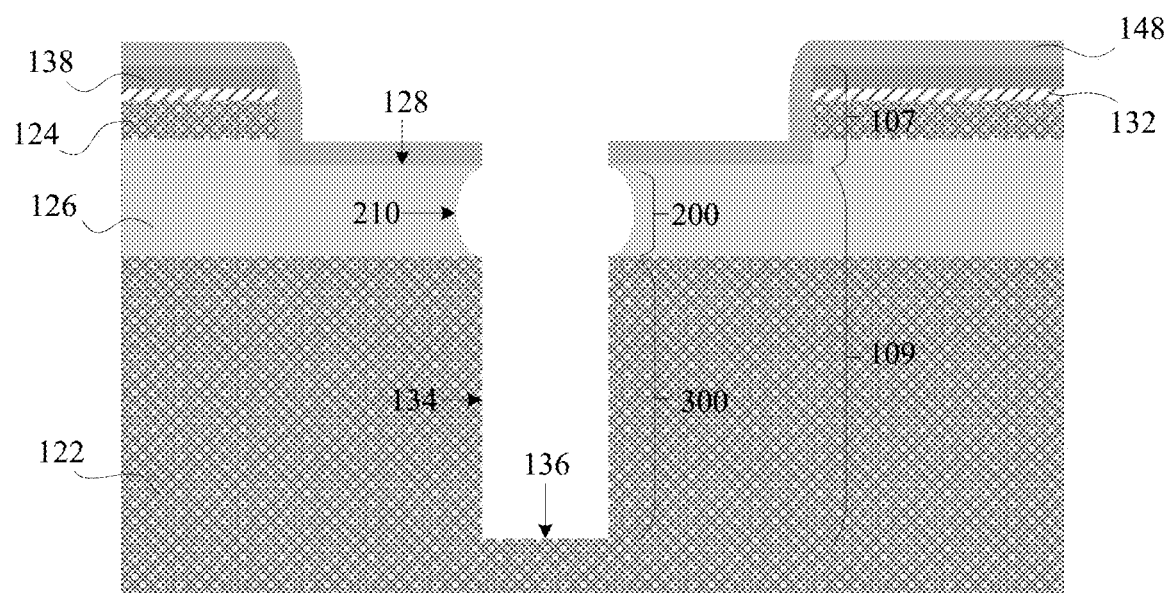
Figure 3G:
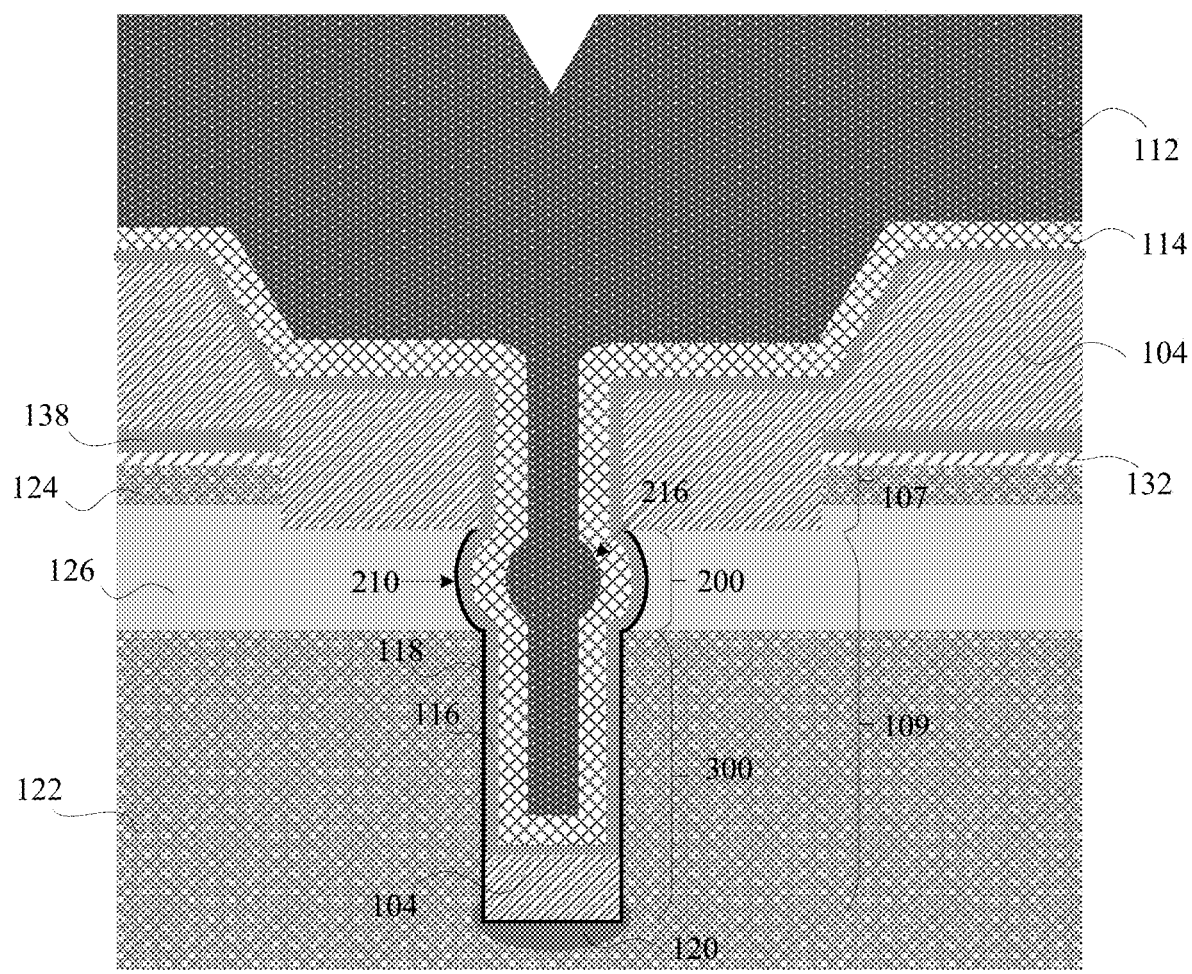
Figure 3H:
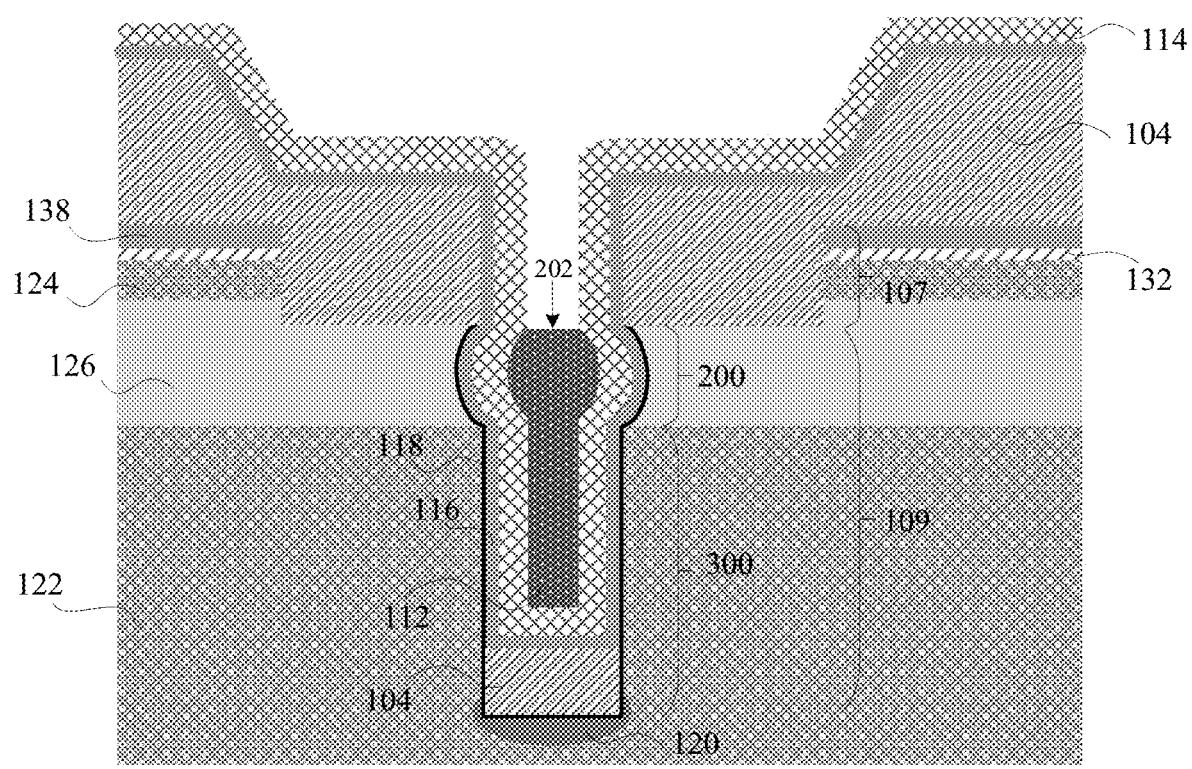
Figure 3I:
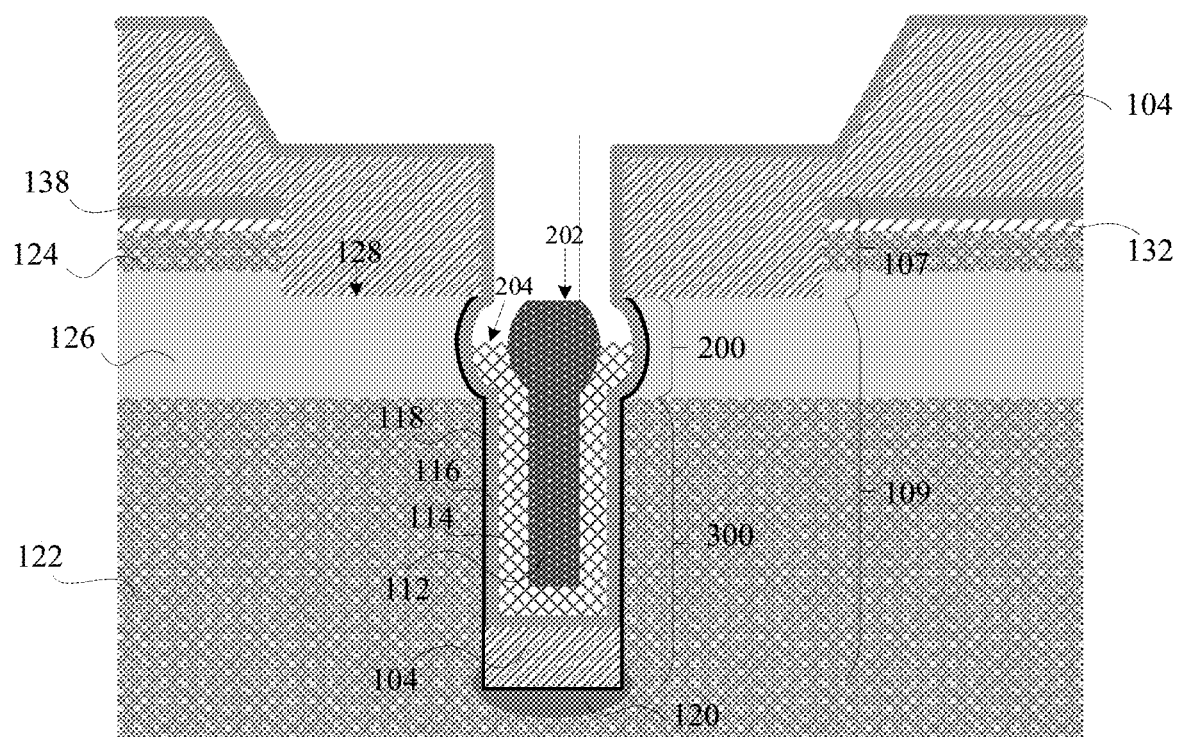
Figure 3J:
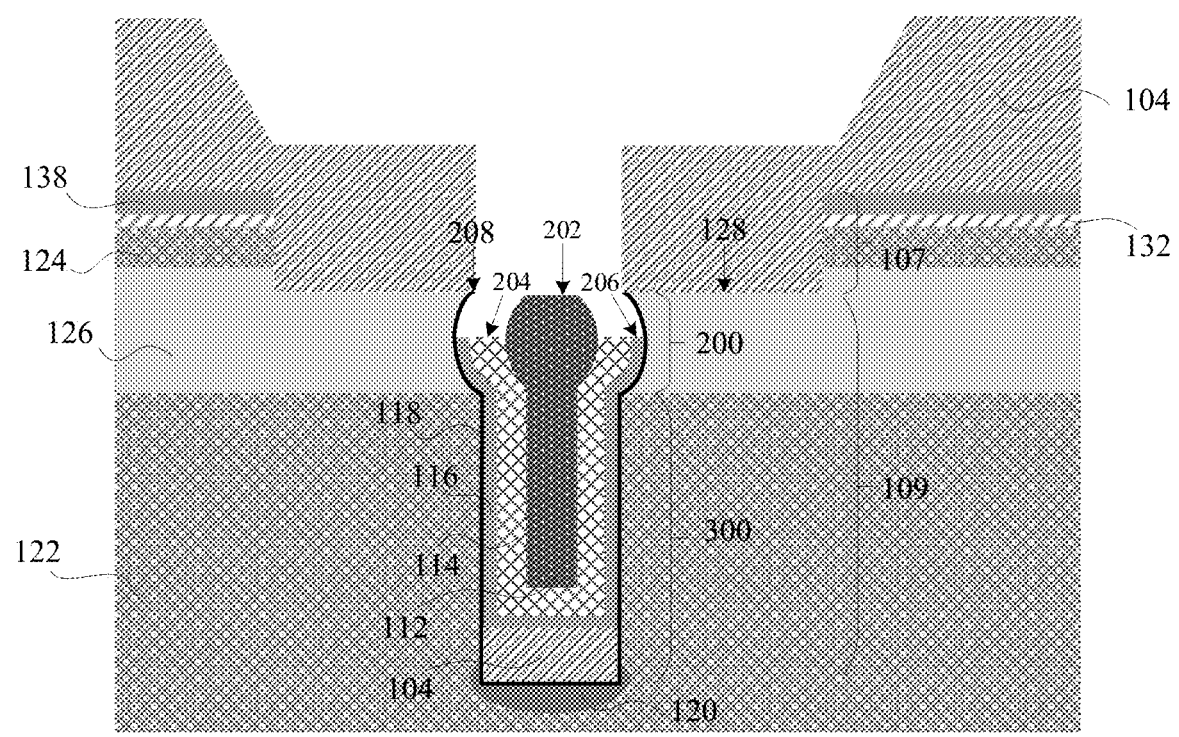
Figure 3K:
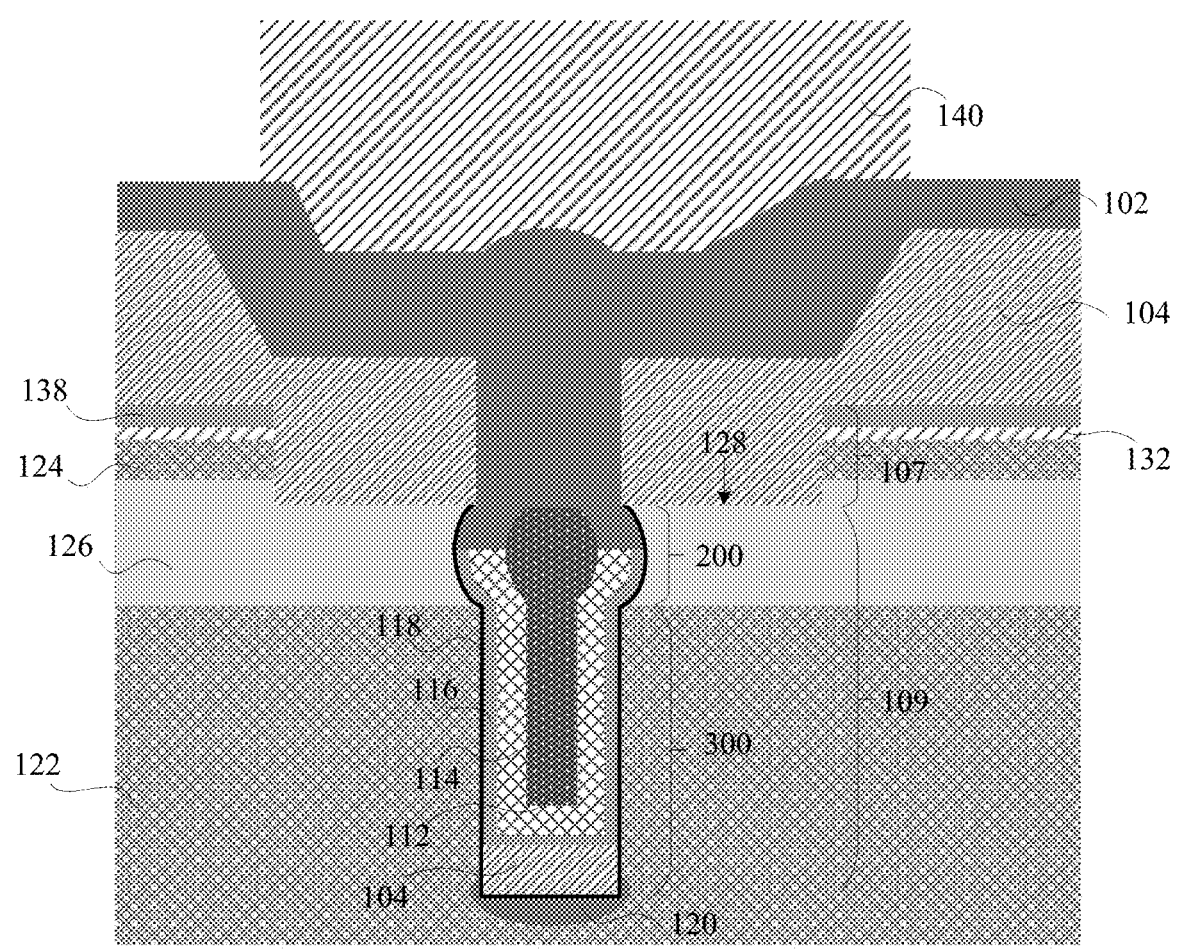

Referring to FIG. 3D, a hard mask layer 148 is formed over the partially processed structure shown in FIG. 2C. The hard mask layer 148 may be formed by suitable deposition processes. The formed hard mask layer 148 covers the pad nitride film 138 and fills the first trench 107. The hard mask layer 148 is also deposited on the thermal oxide film in the first trench (not shown). The hard mask layer 148 may include an oxide material such as silicon dioxide, silicon oxynitride, tetraethyl orthosilicate (TEOS). The second trench opening 146 is formed in the hard mask layer 148 to expose the bottom surface 128 of the first trench 107. The second trench opening 146 may be formed by suitable etching techniques described in FIG. 2D. Referring to FIG. 3E, the bottom surface 128 of the first trench 107 is subsequently etched to extend into the semiconductor substrate 122 and form a second trench 109. The steps to form the second trench shown in FIG. 3E are the same as the steps described in FIG. 2E.

FIGS. 3F(i)-3F(iii) illustrate forming an outer dielectric liner and an etch stop layer in the partially processed structure shown in FIG. 3E in accordance with the present disclosure. Referring to FIG. 3F(i), an outer dielectric liner 118 and a channel stop region 120 are formed in the second trench 109. The outer dielectric liner 118 and the channel stop region 120 are formed in the same manner as described in FIG. 2F. Referring to FIG. 3FB, an oxide layer 104 is formed over the hard mask layer (not shown) and the bottom surface 136 of the second trench 109. In one embodiment, the hard mask layer and the oxide layer 104 are of the same material. The formation of the oxide layer 104 may be performed by suitable deposition processes. In another embodiment, the oxide layer 104 is preferably deposited by using a high density plasma deposition technique. During this deposition, only the horizontally exposed portion of the outer dielectric liner 118 within the second trench 109 is deposited with the oxide layer 104, while the vertically exposed portion of the outer dielectric liner 118 are unaffected, as shown in FIG. 3F(ii). Referring to FIG. 3F(iii), an etch stop layer 116 is then formed to cover the formed oxide layer 104 as well as the vertically exposed portion of the outer dielectric liner 118. The etch stop layer 116 may be formed in similar manner as described above in FIG. 2F.

FIGS. 3G-3K illustrate successive stages of processing the partially processed structure described in FIG. 3FC. FIGS. 3G-3K are cross section views that are similar to those of FIGS. 2G-2K, but also includes an oxide layer 104 disposed in the bottom section 300 of the deep trench isolation 110. FIGS. 3G-3K illustrates the same steps described in FIGS. 2G-2K to form the semiconductor isolation structure shown in FIG. 1B'.

Advantageously, it is found that the semiconductor isolation structures formed by the methods of the present disclosure enables defect detection of formed isolation structures, eliminates occurrence of single crystal spike defects and also eliminates the dependency of shallow trench formation on the pattern density of formed deep trenches.

As used herein, the term "deposition processes" generally refers to the process of applying a material over another material (or the substrate). Exemplary techniques for deposition include, but not limited to, CVD, physical vapor deposition (PVD), sputtering, or spin-coating.

As used herein, the term "suitable patterning techniques" includes, but not limited to, wet etch lithographic processes, dry etch lithographic processes or direct patterning processes. Here, the term "processes" includes deposition of material or photoresist, patterning, exposure, development, etching, cleaning, and/or removal of the material or photoresist as required in forming a described structure.

Throughout this disclosure, the terms top, upper, upwards, over, and above refer to the direction away from the substrate. Likewise, the terms bottom, lower, downwards, under, and below refer to the direction towards the substrate. It is to be understood that the terms so used are interchangeable under appropriate circumstances such that the embodiments of the device described herein are, for example, capable of operation in other orientations than those illustrated or otherwise described herein.

Similarly, if a method is described herein as involving a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device. Occurrences of the phrase "in one embodiment" herein do not necessarily all refer to the same embodiment.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein. Furthermore, there is no intention to be bound by any theory presented in the preceding background or the following detailed description.

Additionally, the various tasks and processes described herein may be incorporated into a more comprehensive procedure or process having additional functionality not described in detail herein. In particular, various processes in the manufacture of integrated circuits are well-known and so, in the interest of brevity, many conventional processes are only mentioned briefly herein or omitted entirely without providing the well-known process details.

As will be readily apparent to those skilled in the art upon a complete reading of the present application, the semiconductor isolation structures and methods of manufacture disclosed herein may be used in association with a variety of different integrated circuit products, including, but not limited to, SiGe based devices, CMOS, bipolar, and a combination of bipolar and CMOS (BiCMOS) semiconductor devices, etc.

What is claimed is:

1. A semiconductor isolation structure comprising:
   a semiconductor substrate;
   a shallow trench isolation (STI) disposed over the semiconductor substrate;
   a doped subcollector disposed over the semiconductor substrate;
   a deep trench isolation (DTI) with sidewalls extending from a bottom surface of the STI, through the doped subcollector, and terminating in the semiconductor substrate, wherein the DTI has a bowed section formed in the doped subcollector layer below the STI;
   a multilayer dielectric lining disposed on the sidewalls of the DTI, wherein the multilayer dielectric lining comprises an etch stop layer positioned between inner and outer dielectric liners; and
   a filler material disposed within the DTI.

2. The isolation structure of claim 1, wherein the filler material has a top surface that is substantially level with the bottom surface of the STI.

3. The isolation structure of claim 2, wherein the etch stop layer and the inner dielectric liner have top edge portions that are recessed below the top surface of the filler material.

4. The isolation structure of claim 1, wherein the outer dielectric liner is formed on the sidewalls of the DTI and has a top edge portion that contacts the bottom surface of the STI.

5. The isolation structure of claim 2, wherein the outer dielectric liner has a top edge portion that is recessed below the top surface of the filler material.

6. The isolation structure of claim 1, wherein the doped subcollector layer comprises regions with different dopant concentrations.

7. The isolation structure of claim 6, wherein the region with a highest dopant concentration is aligned with the bowed section of the DTI having a maximum width.

8. The isolation structure of claim 1, wherein the STI includes an oxide layer surrounding a capping layer that is disposed on the top surface of the filler material and covers the multilayer dielectric lining.

9. The isolation structure of claim 8, wherein the DTI includes a bottom section having the oxide layer disposed on top of the outer dielectric liner and beneath the filler material.

10. The isolation structure of claim 1, wherein the DTI has a depth that is greater than a pre-determined depth for the STI.

11. The isolation structure of claim 1, wherein a top surface of the filler material is below the bottom surface of the STI.

12. The isolation structure of claim 11, wherein the top surface of the filler material is located within the bowed section.

13. The isolation structure of claim 12, wherein the top surface of the filler material is above a maximum width of the bowed section.

14. The isolation structure of claim 1, wherein the multilayer dielectric lining conforms to the bowed sidewalls of the DTI.

15. The isolation structure of claim 14, wherein the filler material has bowed sidewalls that are within the bowed section of the DTI.

16. The isolation structure of claim 15, wherein the bowed sidewalls of the filler material corresponds to the concavity of the bowed sidewalls of the DTI.

17. The isolation structure of claim 15, wherein the STI includes a capping layer that is disposed on a top surface of the filler material.

18. The isolation structure of claim 17, wherein the capping layer extends below the top surface of filler material to surround a portion of the bowed sidewalls of the filler material.

* * * * *